United States Patent
Evans et al.

(10) Patent No.: US 10,151,777 B2
(45) Date of Patent: Dec. 11, 2018

(54) METHODS AND SYSTEMS FOR ACCURACY IMPROVEMENT IN CURRENT COMPARATORS

(71) Applicant: Guideline Instruments Limited, Smiths Falls (CA)

(72) Inventors: Mark Evans, Kingston (CA); Iain Page, Ottawa (CA); Tomasz Barczyk, Ottawa (CA); Kenneth Mikolajek, Belgrade (RS)

(73) Assignee: GUIDELINE INSTRUMENTS LIMITED, Smiths Falls (CA)

( * ) Notice: Subject to any disclaimer, the term of this patent is extended or adjusted under 35 U.S.C. 154(b) by 54 days.

(21) Appl. No.: 15/454,736

(22) Filed: Mar. 9, 2017

(65) Prior Publication Data

US 2017/0184637 A1   Jun. 29, 2017

Related U.S. Application Data

(63) Continuation of application No. 14/320,741, filed on Jul. 1, 2014, now Pat. No. 9,632,164.

(60) Provisional application No. 61/842,184, filed on Jul. 2, 2013.

(51) Int. Cl.
*G01R 17/10* (2006.01)
*G01R 35/02* (2006.01)
*G01R 15/18* (2006.01)
*G01R 27/14* (2006.01)

(52) U.S. Cl.
CPC ........ *G01R 17/105* (2013.01); *G01R 15/183* (2013.01); *G01R 27/14* (2013.01); *G01R 35/02* (2013.01)

(58) Field of Classification Search
None
See application file for complete search history.

(56) References Cited

U.S. PATENT DOCUMENTS

| 8,106,669 B2 * | 1/2012 | Perras | G01R 27/14 324/706 |
| 2012/0187966 A1 * | 7/2012 | Perras | G01R 27/14 324/706 |

* cited by examiner

*Primary Examiner* — Jermele M Hollington
*Assistant Examiner* — Douglas X Rodriguez
(74) *Attorney, Agent, or Firm* — Greer, Burns & Crain, Ltd.

(57) ABSTRACT

Precision AC and DC voltage, current, phase, power and energy measurements and calibrations with current ranges from 1 uA to 20 kA and voltage ranges from 1V to 1000 kV are now performed with accuracies of better than one part per million. Continued demand for improved accuracy has led the inventors to address remnant magetization within the current comparators that form the basis of the measuring process within many of the measurement instruments providing the precision AC and DC measurements and calibrations. Accordingly, the inventors present current comparator and measurement system architectures together with control protocols to provide for correction of this remnant magnetization.

18 Claims, 16 Drawing Sheets

METHODS AND SYSTEMS FOR ACCURACY IMPROVEMENT IN CURRENT COMPARATORS

CROSS-REFERENCE TO RELATED APPLICATIONS

This patent application claims the benefit of priority from U.S. Provisional Patent Application U.S. 61/842,184 filed Jul. 2, 2013 entitled "Methods and Systems for Accuracy Improvement in Current Comparators" the entire contents of which are incorporated herein by reference.

FIELD OF THE INVENTION

This invention relates to electrical measurement and calibration systems and more particularly to current comparator based measurement and calibration systems with better than parts per million accuracy.

BACKGROUND OF THE INVENTION

Alternating Current (AC) and Direct Current (DC) electrical measurements are used in a wide variety of applications and may be performed for a variety of electrical quantities including voltage, current, capacitance, impedance, resistance etc. These tests and measurements include those relating to designing, evaluating, maintaining and servicing electrical circuits and equipment from high voltage electrical transmission lines operating at hundreds of kiloVolts (kV) and kiloAmps (kA) to industrial/medical/residential electrical and lighting, typically 400V/240V/100V and 30/15 A, to a wide variety of industrial/scientific/medical/consumer electrical and electronic devices.

Within a variety of applications and test equipment comparator bridges, e.g. AC comparator bridges and DC comparator bridges, are employed to provide the required dynamic range, accuracy, and flexibility. Such bridge configurations remove many of the issues associated with achieving making measurements at accuracies of a part, or few parts, per million such as insensitivity to lead resistances, excellent ratio linearity, excellent ratio stability, and a high level of resolution. As such DCC bridges, for example, have replaced resistance ratio instruments such as the Wenner and Kelvin bridges for resistance measurements. Typically, comparator implementations provide accuracies within the range of 0.1 ppm to 1.0 ppm.

However, with the continued drive for improved accuracy in calibration, standards, and measurements on circuits and components operating at hundreds of kiloVolts, thousands of Amps, with resistances into Gigaohms accuracies of parts per million is being replaced by parts per billion. For example, Guildline Instruments offers a range of DCC bridges starting at 100 parts per billion over the range 0.001Ω to 100 kΩ to extended performance DCC bridges at fifty (50) parts per billion for measurements up to 100 MΩ and currents to 3000 A or forty (40) parts per billion for measurements up to 1 GΩ and 1000V. Other DCC bridges operate at even lower errors of fifteen (15) parts per billion.

At these levels the inventors have identified that a variety of factors, such as interruptions to measurement cycles, e.g. the bridge is unplugged mid-measurement, and manufacturing variations in the current comparator toroids, can generate residual flux within the toroids sufficient to generate offsets within the range of ten (10) to twenty (20) parts per billion. Accordingly, the inventors have established a current comparator design and control approach to address these offsets.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations within the prior art relating to electrical measurement and calibration systems and more particularly to current comparator based measurement and calibration systems with parts per billion accuracy.

In accordance with an embodiment of the invention there is provided a method comprising:
  providing current comparator comprising a predetermined portion of a bridge generating a bi-polar current coupled to a first end of a first winding of the current comparator;
  providing a first load resistor;
  selectively coupling the first winding of the current comparator to ground via the load resistor; and
  generating a first predetermined current profile to initially saturate a magnetic core of the current comparator and subsequently iteratively cycle the current through negative and positive cycles to null the magnetic field within the magnetic core.

In accordance with an embodiment of the invention there is provided a resistance measurement system for generating a bi-polar current comprising:
  a bridge comprising;
    a digital to analog converter for generating a first signal having a defined bi-polar current,
    a first current tracking amplifier for generating a second signal having a defined bi-polar current, and for transmitting the generated second signal to a reference resistor,
    a first comparator for receiving the output of the first current tracking amplifier en route to the reference resistor and for controlling a switch to place the resistance measurement system into the first state and the second state, the first state connecting a secondary input of the bridge to ground and the second state connecting the output of the digital to analog converter to a test resistance; and
    a first current source generating a first predetermined current profile under control of a controller to initially saturate a magnetic core of the first comparator and subsequently iteratively cycle the current through negative and positive cycles to null the magnetic field within the magnetic core; and
  an extender comprising;
    a bi-polar amplifier for receiving the output of the digital to analog converter in the bridge, for amplifying the received converter output, and for transmitting the amplified current signal as an output; and
    a second comparator for receiving the output of the bipolar amplifier, for controlling a second current tracking amplifier to generate and transmit a signal having a defined bi-polar current to the secondary input of the bridge, and for receiving the output of the second current tracking amplifier en route to the secondary input of the bridge.

In accordance with an embodiment of the invention there is provided a current comparator comprising:
  a first winding for receiving a first bi-polar current;
  a second winding for receiving a second bi-polar current;

a third winding for generating an output current in dependence upon at least the first and second bi-polar currents;

a fourth winding coupled to ground on one end and coupled to a current source at another end.

In accordance with an embodiment of the invention there is provided a current comparator comprising:

a first winding for receiving a first bi-polar current;

a second winding for receiving a second bi-polar current;

a third winding for generating an output current in dependence upon at least the first and second bi-polar currents;

a magnetic shield surrounding a magnetic core and the first to third windings;

a fourth winding surrounding a predetermined portion of the magnetic shield coupled to ground on one end and coupled to a current source at another end.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention is directed to electrical measurement and calibration systems and more particularly to current comparator based measurement and calibration systems with parts per billion accuracy.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

Within embodiments of the invention described below in respect of FIGS. 1 through 11 the instruments are described as being resistance measurement systems. However, the embodiments of the invention may be applied to other measurement systems exploiting current comparators as part of the measurement system and/or as the basis of the actual measurement.

Figure 1:
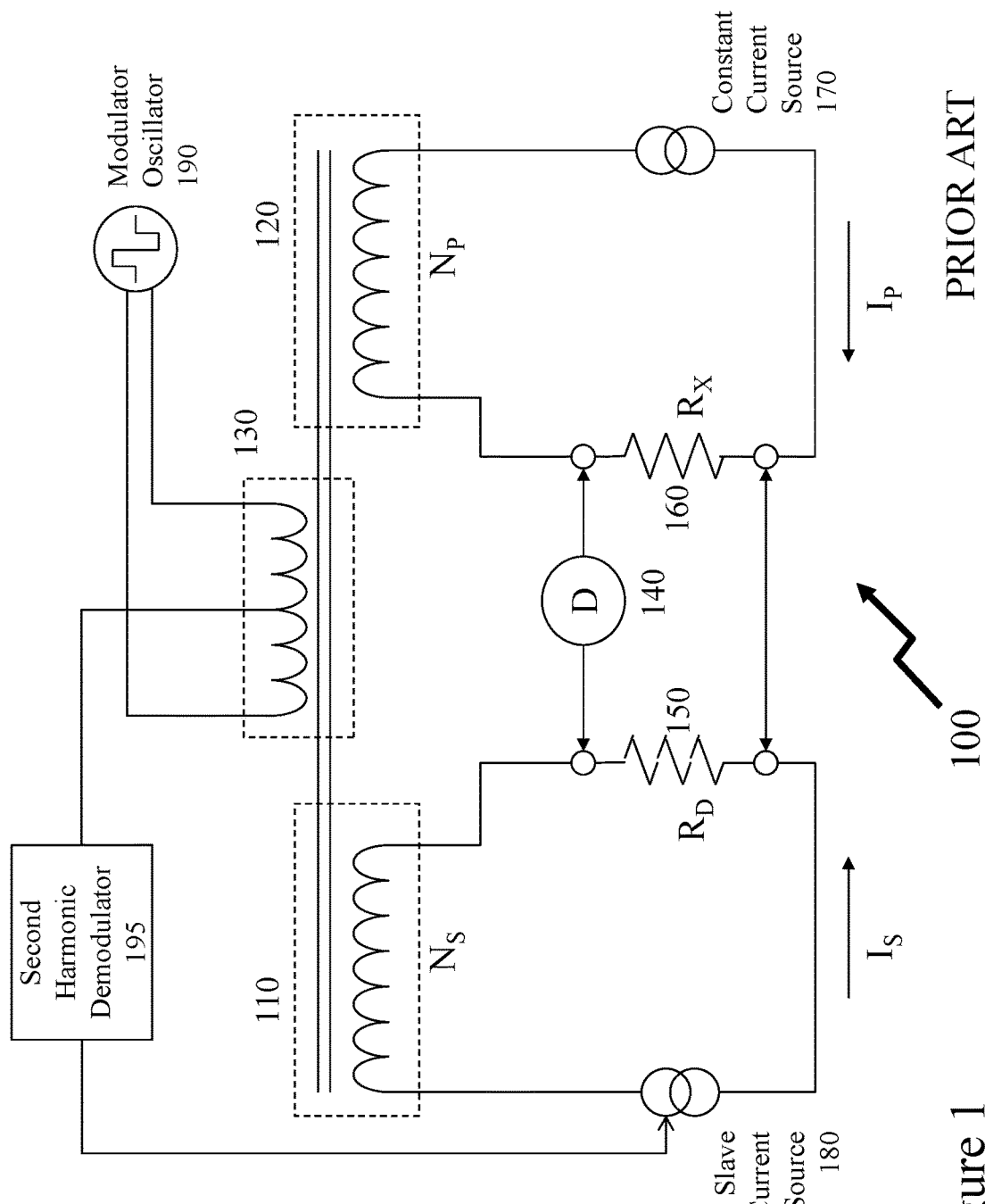
FIG. 1 depicts a direct current comparator bridge according to the prior art as employed by National Institute of Standards and Technology.

In general, the operation of a current comparator is based on Ampere's fundamental law given by Equation (1) where the line integral of the magnetic field H around a closed path dl is equal to the total current I crossing any surface bounded by this path. Referring to FIG. 1 then for an ideal comparator at balance, the total current is carried by two ratio windings, Primary Winding 110 and Secondary Winding 120, and the total number of ampere-turns of one winding is equal and opposite to that of the other winding such that Equation (2) is satisfied where the subscripts P and S refer to the Primary and Secondary Windings 110 and 120, respectively.

$$\oint H \cdot dl = \Sigma I \quad (1)$$

$$\Sigma I = N_P I_P - N_S I_S = 0 \quad (2)$$

Accordingly, the current ratio of the comparator, $I_P/I_S$, is therefore equal to the inverse of the turns ratio, $N_S/N_P$. In order to obtain high ratio accuracies, the ampere-turn balance or zero flux condition is determined by some type of flux detector system that is only sensitive to the mutual fluxes generated by the ratio windings. In practice, a DCC achieves good ratio accuracy and sensitivity by utilizing high-permeability toroidal cores, magnetic and eddy-current shields, and careful winding procedures. The main component of a DCC consists of a pair of high-permeability cores, surrounded by a magnetic shield, over which are the ratio windings that carry the direct currents to be compared. Cryogenic current comparators are similar in concept, but make use of the ideal magnetic shielding properties of a self-enclosing, but non-continuous, surface made of superconducting material.

The currents for the ratio windings are supplied by two isolated direct current sources, such as Constant Current Source 170 and Slave Current Source 180. In some embodiments the cores and within the magnetic shield of the DCC is wound a Modulation-Detection Winding 130 which is used to sense the flux condition of the cores. This is achieved by modulating the core permeability through the Modulation-Detection Winding 130 with a Modulator Oscillator 190 and using a Second Harmonic Detector (SHD) Circuit 195. The presence of dc flux in the cores due to primary and secondary ampere-turn imbalance is indicated by this detector output both in magnitude and polarity. The SHD Circuit 195 output is used in a feedback circuit to adjust the current in one of the windings, automatically maintaining ampere-turn balance.

This basic self-balancing DCC resistance bridge in FIG. 1 requires two simultaneous balances, an ampere-turn balance and a voltage balance. The Slave Current Source 180 is continuously adjusted so that ampere-turn balance is maintained. Under this condition, the ampere-turn product of the primary circuit equals that of the secondary circuit, as given by Equation (3).

$$N_P I_P = N_S I_S \quad (3)$$

The voltage balance can be achieved by the adjustment of the number of turns in the primary circuit, $N_P$, until there is a null condition on Detector D 140. Then the voltage drop across the unknown resistor $R_X$, 160 in the primary circuit is equal to the voltage drop across the dummy resistor $R_D$ 150 in the secondary circuit. Accordingly Equation (4) applies and using Equation (3) we obtain Equation (5) for the unknown resistor $R_X$, 160.

$$R_X I_P = R_D I_S \quad (4)$$

$$R_X = (N_P/N_S) R_D \quad (5)$$

Similarly, another measurement with the direct substitution of a known standard resistor $R_S$ of the same nominal value in the primary circuit and re-balancing the detector by adjusting $N_P$ to a new value $N'_P$ results in Equation (6) which when combined with Equation (5) yields Equation (7) where $\Delta N_P = (N_P - N'_P)$, i.e. the number of primary turns between the two voltage balance settings. According, the value of an unknown resistor $R_X$, is determined in terms of a standard resistor and the small relative difference in turns ratio. FIG. 1 depict thereby depicts a direct current comparator bridge according to the prior art such as employed by the National Institute of Standards and Technology (NIST) (NIST Measurement Service for DC Standard Resistors, http://www.nist.gov/calibrations/upload/tn1458.pdf).

$$R_S = (N'_P/N_S) R_D \quad (6)$$

$$R_X = \left(1 + \frac{\Delta N_P}{N'_P}\right) R_S \quad (7)$$

Figure 2:
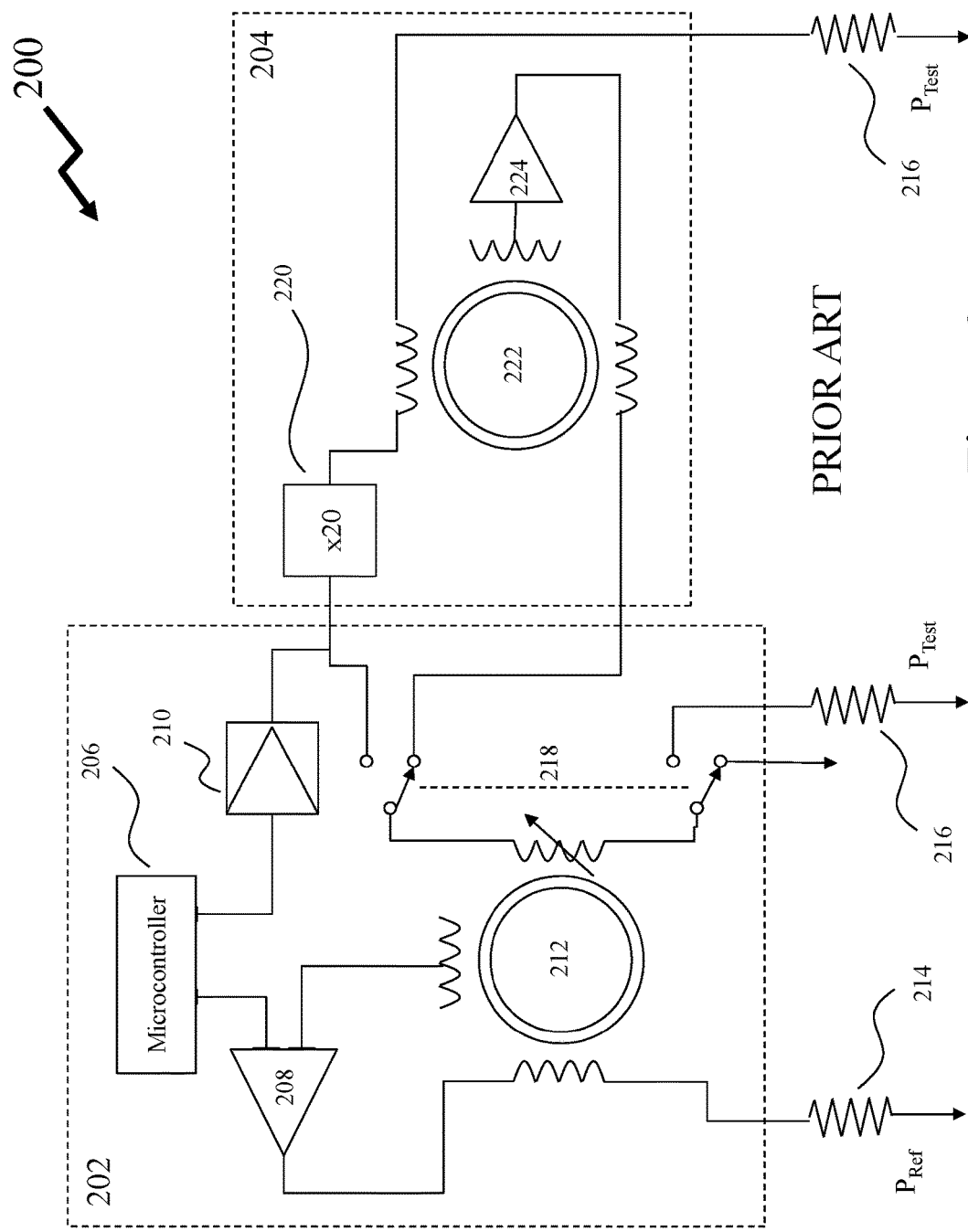
FIG. 2 depicts a block diagram of an automatic microprocessor controlled measurement system comprising a current comparator bridge with a directly slaved extender.

Referring to FIG. 2, a Resistance Measurement System (RMS) 200 makes use of a low Current Comparator (CC) Bridge 202 and an Intermediate Current Range (ICR) Extender 204. The CC Bridge 202 generates a bi-polar current as directed by microcontroller 206. Microcontroller 206 controls Amplifier 208, which is used to amplify a signal. The Amplifier 208 is preferably a servo current tracking amplifier which can produce an output current in the range of 0 mA to ±150 mA. The microcontroller 206 also connects to digital to analog converter (DAC) 210 which also provides an output in the range of 0 mA to ±150 mA. The second input to amplifier 208 is connected to the winding of Comparator 212 of the bridge. The 0 mA to ±150 mA output of the amplifier 208 is also connected to the winding of Comparator 212 before it is connected to the reference resistance ($P_{REF}$) 214. A winding of Comparator 212 is also connected to a switch 218. In one position, switch 218 will provide a connection to ground that feeds to the ICR Extender 204. In the second position, it will connect a test resistance ($P_{TEST}$) 216 to allow the bridge to test the resistance with a low current of 0-±150 mA.

The ICR Extender 204 extends the current test range of CC Bridge 202 in the RMS 200. It connects to the CC Bridge 202 to receive both control information and an input current. Its output is connected to $P_{TEST}$ 216 to provide an intermediate level current. In the illustrated embodiment, the intermediate current level is a current range of 0 mA to ±3 A due to the use of a 20×amplifier. One skilled in the art will appreciate that a different output current can be obtained by using a different amplifier stage. The ICR Extender 204 includes a bipolar DC current amplifier 120 with a range of 0 to ±3 Amperes (or higher in other embodiments) directly coupled to the high current primary winding of the integrated ICR Current Comparator 222 and a servo amplifier 224 that provides sufficient lower level current through the secondary winding of the ICR Current Comparator 222 to balance the ICR Current Comparator 222 under all operating conditions. The output of the primary winding is connected to $P_{TEST}$ 216 and the output of servo 224 through the extender secondary winding is connected back to the automated resistance CC Bridge 202 and as such the CC Bridge 202 can maintain balance within the bridge current Comparator 212.

The output of the DAC 210 in CC Bridge 202 is the primary input to the ICR Extender 204. This output is a signal between 0 mA to ±150 mA which is provided to a directly coupled bi-polar current amplifier 220. The use of the bipolar amplifier 220 allows the obviation of mechanical switches that are required in the prior art. The manner in which the ICR Extender 204 connects to the CC Bridge 202 allows the overall system to remain balanced, which is a factor in why the prior art maintained its reliance on the mechanical switches. The output of bi-polar amplifier 220 is passed through the primary winding of ICR Current Comparator 222, and is then provided as an output to the Extender 204 through P Test 216. Another winding on ICR Current Comparator 222 is used as the input to servo tracking amplifier 224, whose output is passed through a third winding on ICR Current Comparator 222. This signal (the output of amplifier 224) is transmitted back to the CC Bridge 202 which connects the signal to the switch 218. When in the first position, switch 218 connects this output to ground to balance the measurement system. In the second position, switch 218 connects the output of the DAC 210 to $P_{TEST}$ 216, thus providing a current of 0 mA to ±150 mA to $P_{TEST}$ 216, as opposed to the output of 0 mA to ±3 A provided by the output of Extender 204.

This configuration allows the resistance measurement RMS 200 to perform resistance measurements at much higher currents than the CC Bridge 202 would be able to as a result of its limitation of 0 mA to ±150 mA. This increase in the output makes use of the cascaded configuration. The accuracy of the measurement is dependent mainly on the accuracy of the current comparison within the comparators 212 and 222. In the illustrated implementation, the base configuration can be integrated directly within the main assembly of the low level current comparator resistance measurement CC Bridge 202 such that no manual connections are required with the exception of connections to the test resistance $P_{TEST}$ to be measured. The utilization of the bipolar directly coupled DC current amplifier 220 eliminates the requirement for reversing relays, external current supplies and the resulting complexity of interconnections. The use of a voltmeter to measure the potential drop across the test resistance 216 and reference resistance 214 can be performed as used in the prior art. However, as discussed above, for an accurate reading, the difference in the voltage drops across the test resistance 216 and the reference resistance 214 is driven towards zero, and the comparators 212 and 222 are employed to determine the current ratio directed to the two resistances. Knowing this ratio and the winding ratio of the comparators 212 and 222 allows the RMS 200 to determine the unknown resistance of $P_{TEST}$ 216 to a high degree of accuracy. It would be evident to one skilled in the art that the CC Bridge 202 may be operated discretely without the ICR Extender 204.

Figure 3:
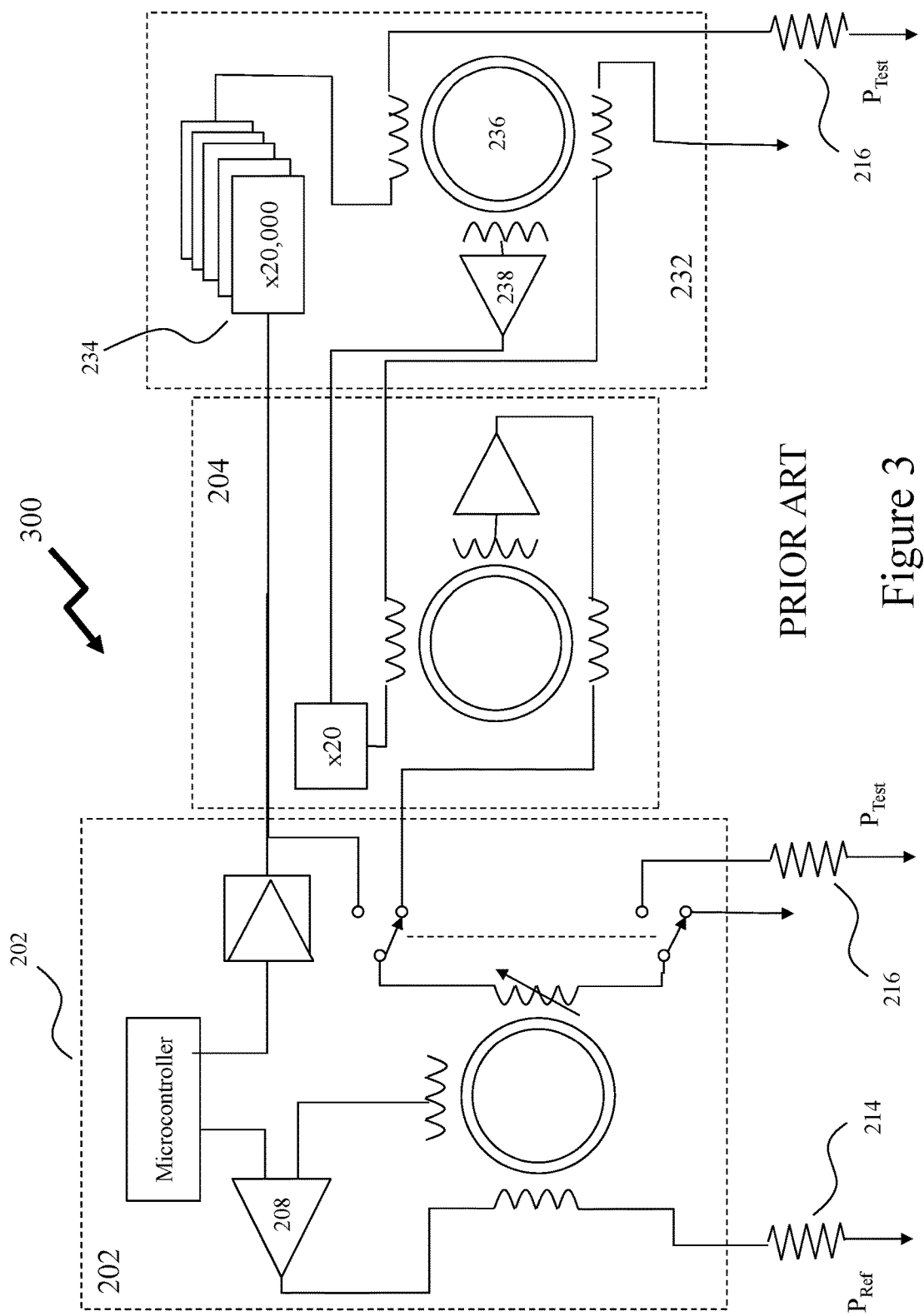
FIG. 3 depicts a block diagram of an automatic microprocessor controlled measurement system comprising a current comparator bridge with a directly slaved extender and high current extenders.

An Augmented Resistance Measurement System (ARMS) 300 is illustrated in FIG. 3. The ARMS 300 builds upon the configuration illustrated in FIG. 2 with the addition of a high Current Comparator (CC) Extender 232. The CC Extender 232 includes a High Current Comparator 236 that is connected to a modular bipolar directly coupled high current amplifier 234, a servo amplifier 238, and the output of amplifier 220. The bipolar high current amplifier 234 is directly coupled through the primary winding side of the High Current Comparator 236 to the resistance device $P_{TEXT}$ 216 and can include multiple modules such that full scale currents up to ±3000 Amperes or higher may be attained, preferably in multiples of ±150 A in the present embodiment. Servo amplifier 238 receives its input from High Current Comparator 236, and its output is connected back into the input of the intermediate level Extender 204 and is fed to that stage's bipolar current amplifier 220. The output of intermediate current amplifier 220 is coupled through the primary winding of the intermediate level ICR Current Comparator 222 and also through the secondary winding of the High Current Comparator 236 such that both the intermediate ICR Current Comparator 222 and the High Current Comparator 236 can maintain current balance under all operating conditions. The configuration is completed with the direct coupling of the output of the servo amplifier 224 of the intermediate level current Extender 204 through the secondary winding of the ICR Current Comparator 222 and the current Comparator 212 of the CC Bridge 202 as described in relation to the embodiment of FIG. 2. The utilization of a modular build-up of directly coupled high current amplifiers allows for a multiplicity of current ranges to be implemented and upgraded from ±150 A to ±3000 A or higher and also eliminates the requirement for specially designed very high current pneumatically or otherwise mechanically actuated reversing relay contacts, external commercial power supplies and the associated more complex interconnections.

As illustrated in FIG. 3, the CC Bridge 202 and Extender 204 of the ARMS 300 are configured largely as they were in RMS 200 of FIG. 2. One notable difference is that the input to Extender 204 is routed through High Current CC Extender 232 which in turn is connected to CC Bridge 202. Thus, though the input to Extender 204 is still the output of CC Bridge 202, it is not a direct connection. The output of DAC 210, which in this exemplary embodiment is a signal of 0-±150 mA, is provided to high current bipolar amplifiers 234. These amplifiers are preferably parallel amplifiers that allow, in the illustrated embodiment, an amplification of up to 20,000×, allowing for an output signal ranging from 0 mA to ±3000 A. One skilled in the art will appreciate that higher or lower amplification ratios can be employed without departing from the scope of the present invention. This output signal is passed through the primary windings of High Current Comparator 236 and then provided as an external output of the stage to $P_{TEST}$ 216. A Servo Current Tracking Amp 238 receives input from the High Current Comparator 236 and provides its output signal, of 0 mA to ±150 mA to the input of the Extender 204, which provides the input signal to amplifier 220. The resulting 0 mA to ±3 A signal is passed through the primary winding of ICR Current Comparator 222, and then through the secondary winding of High Current Comparator 236. The ICR Current Comparator 222 of the Extender 204 is connected back to the CC Bridge 202 through servo tracking amplifier 224 as was described in FIG. 2. In an embodiment the amplifier 234 is a modular amplifier that can be built as ±150 A modules connected in parallel to allow for an output of ±3000 A. This allows the test resistance to be supplied a reliable bipolar current of 0 mA to ±3000 A which is typically sufficient in most instances to create a potential drop across the resistances that can be measured accurately by the CC Bridge 202. The known current ratios can then be used to determine the unknown resistance. One skilled in the art will appreciate that other factors can be determined by knowing the current ratios.

Figure 4:
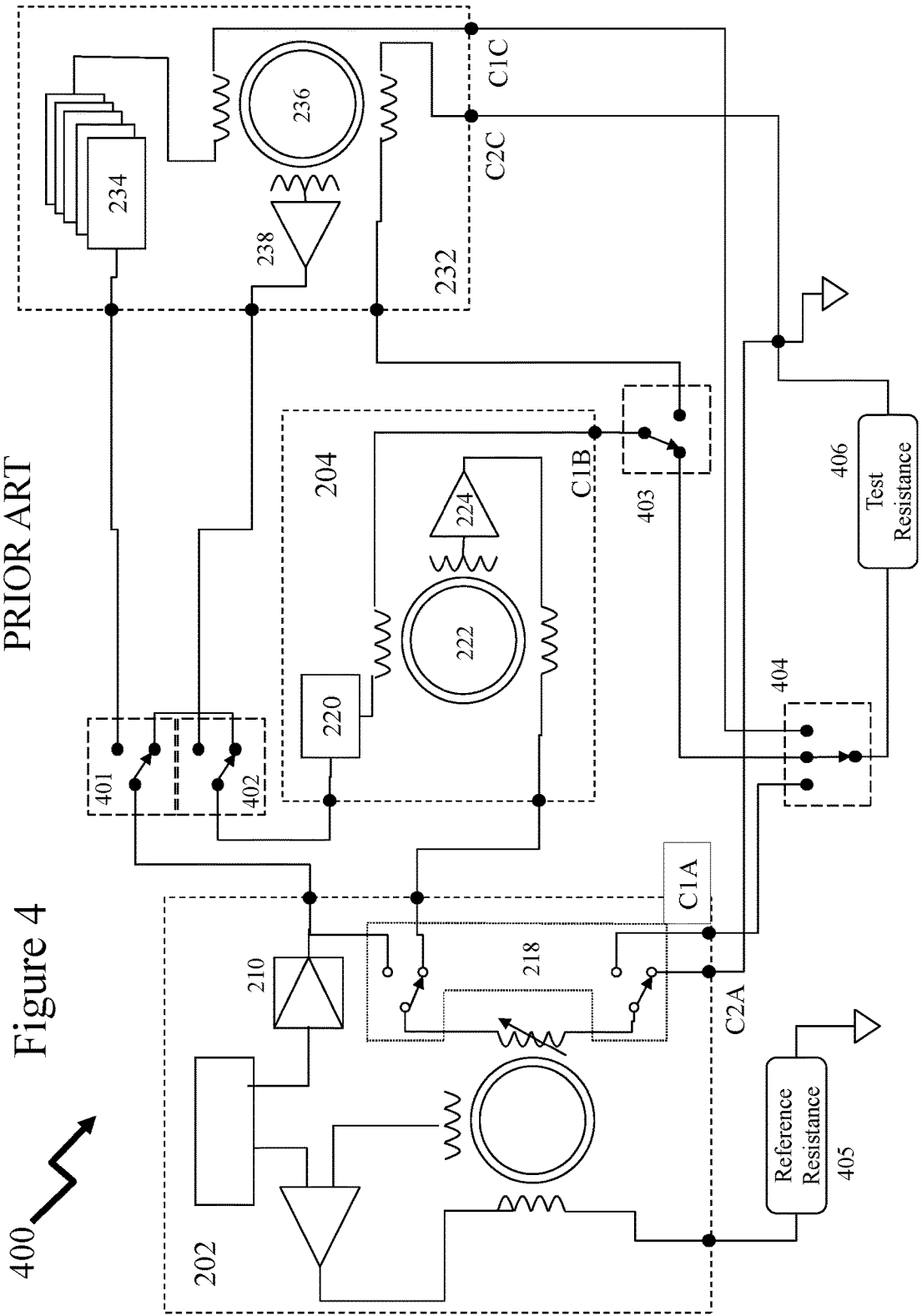
FIG. 4 depicts a block diagram of an automatic microprocessor controlled measurement system comprising a current comparator bridge with a directly slaved extender and high current extenders.

Referring to FIG. 4 there is depicted an electronically re-configurable implementation of the ARMS 300 as described and depicted in FIG. 2. Accordingly Electronically Reconfigurable ARMS (ERARMS) 400 comprises the CC Bridge 202 and ICR Extender 204 together with the CC Extender 232 as discussed supra in respect of FIG. 3. As such the ERARMS 300 may provide three output current ranges to the Test Resistance 406 based upon the configuration of the first to fourth configuration switches 401 through 404 respectively. In a first configuration the output of the DAC 210 is routed by switch 218 to the bridge output C1A of the Bridge 202. In a second configuration the output of the DAC 110 is routed to the amplifier 220 within the ICR Extender 204 and thereby to the extender output C1B of the ICR Extender 204. In a third configuration the output of the DAC 110 is routed to the high current bipolar amplifiers 234 within the CC Extender 232 and therein to the high current extender output C1C. Coupling these three outputs to the fourth configuration switch 404 allows the selected current range to be coupled to the Test Resistance 406. The other side of the Test Resistance 406 being coupled to bridge input port C2A of Bridge 202 and extender input port C1B of CC Extender 232. First and second configuration switches 401 and 402 manage the routing of the output of the DAC 210 to the ICR Extender 204 and High Current Extender in the second and third configurations and the routing of the Servo Current Tracking Amp 138 to the input of amplifier 220 in the third configuration. Third configuration switch 403 manages routing of the output port of the amplifier 220 between the fourth configuration switch 404 and High Current Comparator 236 in the second and third configurations respectively.

Accordingly, where the first to fourth configuration switches 401 through 404 are controlled through a controller, not shown for clarity, together with switch 218 then the re-configurable system 300 provides multiple programmable output ranges such as the ±150 mA, ±3 A, or ±3000 A discussed above provided by exemplary embodiments of the Bridge 102, ICR Extender 204, and CC Extender 232. It would be evident to one skilled in the art that the re-configurable system 300 may be implemented in a modular manner such as for example by providing Bridge 202, ICR Extender 204, and CC Extender 232 as discrete units together with first to fourth configuration switches 401 through 404. Alternatively as first to third configuration switches 401 and 404 relate to interconnections and input/outputs of ICR Extender 204 and CC Extender 232 these may be provided within a single module with the CC Extender 232. It would also be evident that the CC Extender 232 which within the embodiments above provides multiplication of the output of the DAC 210 may be similarly implemented in modular format either through multiple amplifier stages with single comparator stage or multiple High Current Extenders 232 with appropriate switching elements. It would be further evident that the fourth configuration switch 404 may alternatively be a 1:4, 1:5, 1:6, of 1:N switch rather than the 1:3 switch depicted.

CC Extender 232 in FIGS. 2 and 3 is depicted as being implemented with multiple high current bipolar amplifiers 234. Accordingly CC Extender 232 may provide multiple output current ranges with the provision of additional primary windings with appropriate switching elements to provide more output current options. Alternatively it would be evident to one skilled in the art that the multiple high current bipolar amplifiers 234 may be similarly switchably engaged thereby providing additional output current ranges for the resistance measurement systems described above in respect of FIGS. 2 through 4. It would also be evident that alternatively multiple High Current Extenders 232 may be employed with different gain factors and maximum output current range to provide a modular approach to currents of ±3000 A or higher.

Accordingly, it would be evident that systems such as RMS 200, ARMS 300 and ERARMS 400 provide measurement capabilities over a wide range of resistances, currents, and voltages. For example, such systems can measure resistances as low as 1 μΩ at 300 A all the way through to 1 GΩ at 1 kV and others operating at 10,000 A. In parallel to DC current comparator based measurement systems there are a corresponding parallel set of AC current comparator based measurement systems. As noted supra evolving measurement requirements have shifted the error in such measurements from a few parts per million to tens or hundreds of part per billion and as a result error sources that were previously minor but known factors or unknown factors become important and require correction in order to reduce or remove these error sources. Accordingly, the behaviour of the toroidal current transformer at parts per billion becomes important.

During normal operation of such test systems as RMS 200, ARMS 300 and ERARMS 400 the test resistor 216 or test resistance 406 is cycled through a range of operational voltages and currents generated by DAC 210 under control of the Microcontroller 206. However, during this operation interruption of the testing, e.g. turning off the system, disconnecting power supply, disconnecting device under test, etc may leave remanent flux within the core of one or more of the current comparators within the test and measurement system (TMS). Such remanence magnetization being more likely when such an interruption occurs at high current and/or voltage but it may also arise as a result of anhysteretic remanence or anhysteretic remanent magnetization (ARM) which arises when the magnetic core of the current comparator toroidal transformers is exposed to a large alternating field with a small DC bias field. It would be evident that where a large alternating field of ±1 kV is applied then a DC bias field of 1 mV is equivalent to 100 ppb and 10 μV equivalent to 10 ppb.

The remanent magnetization within the transformer core of the current comparator may depend upon many factors including magnitude of the primary current, impedance of the secondary circuit, and the amplitude and time constant of an offset transients. Accordingly, when the current transformer is next energized the flux changes will start from the remanent value and not zero as expected. Accordingly, in order to remove such remanent magnetization it is necessary to degauss the magnetic core of the toroidal transformers within the AC and DC comparators. However, in contrast to prior art transformers wherein degaussing is undertaken in conjunction with primary and secondary windings or current sensors with a sole primary winding the degaussing of AC and DC current comparators requires consideration of the primary, secondary, and tertiary windings.

Accordingly, the inventors have established control and excitation circuits for use in conjunction with the current comparators. The basis of the embodiments of the invention are three elements:

simple, non-accurate, current source providing controlled excitation of current comparator to a maximum predetermined current and subsequent reduction to zero current through a predetermined cycle;

loading of primary and secondary windings with a predetermined load; and trigger and control circuit to determine when to perform the degaussing, for example before any measurement exceeding a predetermined voltage, every time for a current comparator having an intrinsic accuracy exceeding a predetermined level, or after every interrupted measurement.

As will become evident in addition to addressing the transformer core of a current comparator the inventors have also addressed that high accuracy alternating and direct current (AC/DC) comparators are magnetically shielded to reduce the susceptibility of the current comparator to external magnetic fields but that these magnetic shields may themselves become partially magnetized through operation of the AC/DC transformer especially at high currents.

Figure 5:
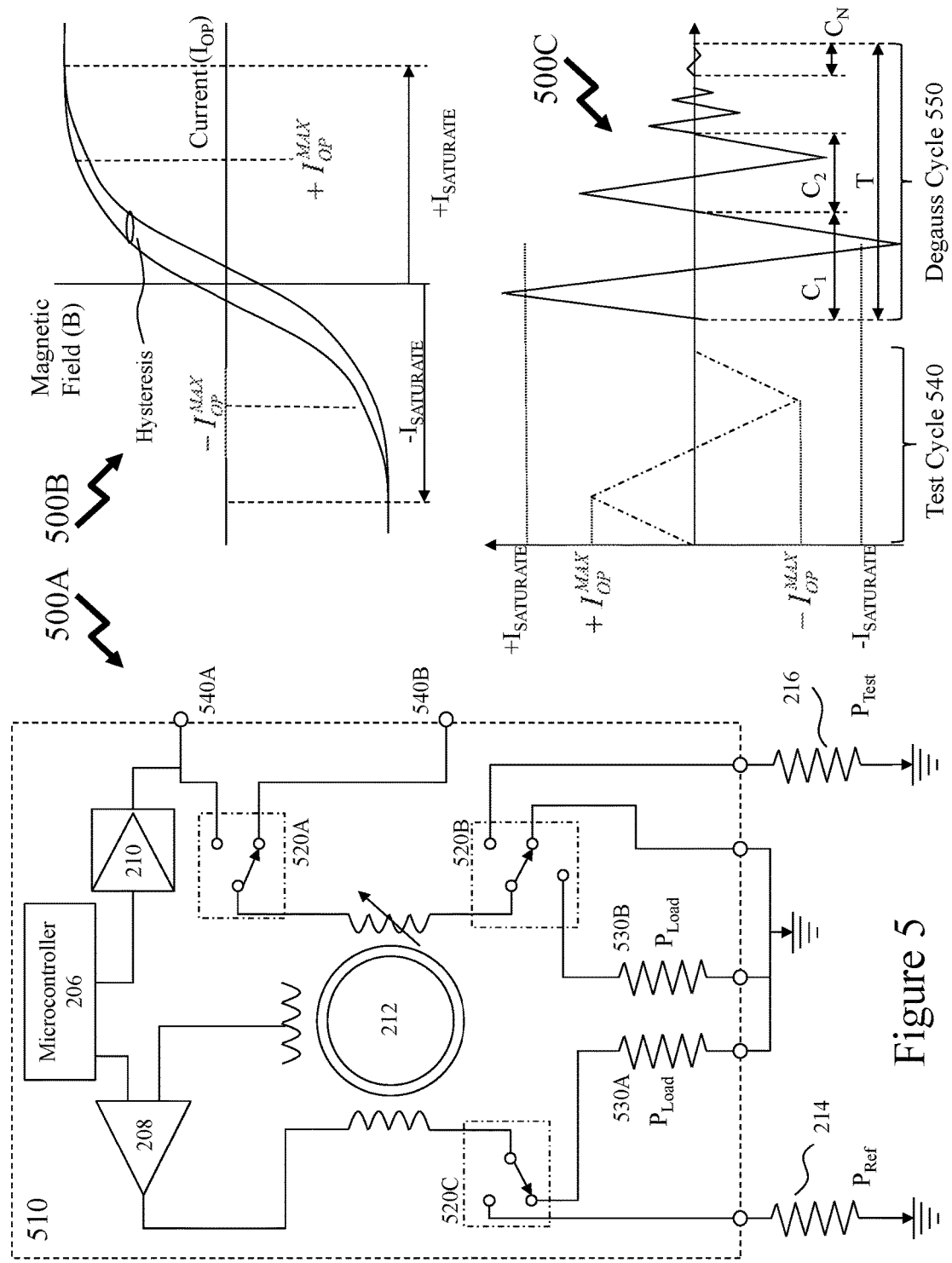
FIG. 5 depicts a block diagram of an automatic microprocessor controlled measurement system current comparator bridge according to an embodiment of the invention.

Referring to FIG. 5 there is depicted in schematic 500A a De-Gaussing Resistance Measurement System (DRMS) 510 according to an embodiment of the invention based upon the architecture of RMS 200 described supra in respect of FIG. 2 based upon CC Bridge 202. Accordingly, DRMS 510 comprises microcontroller 206 in communication with the primary and secondary current sources, namely Amplifier 208 and DAC 210 respectively, which are coupled permanently and switchably to Comparator 212. Switch 218 in RMS 200 is replaced by first and second switches 520A and 520B respectively. First switch 520A provides the same functionality of 1×2 to connect to ports 540A and 540B, corresponding to the output/input feeds of Extender 204 respectively. Second switch 520B is now a 1×3 switch rather than a 1×2 switch such that in addition to providing the original connections to test resistance ($P_{TEST}$) 216 and 500F to ground it also provides a resistive connection to ground via second Load Resistor 530B. Similarly rather than being directly connected to reference resistance ($P_{REF}$) 214 after Comparator 212 the Amplifier 208 is routed via third switch 520C that connects to reference resistance ($P_{REF}$) 214 or via first Load Resistor 530A to ground. Accordingly, through appropriate control of first to third switches 520A to 520C respectively Amplifier 208 and DAC 210 are coupled to ground via the primary and secondary windings of Comparator 212 and first and second Load Resistors 530A and 530B respectively. In this mode Amplifier 208 and DAC 210 as depicted in magnetic field graph 500B and current profile 500C the maximum current delivered is $\pm I_{SATURATE}$ rather than the operational limits $\pm I_{OP}^{MAX}$.

As depicted in magnetic field graph 500B at $\pm I_{SATURATE}$ the magnetic field within the comparator transformer core reaches saturation whereas in normal operation at $\pm I_{OP}^{MAX}$ the comparator transformer core is unsaturated. Accordingly, Test Cycle 540 as depicted in current profile 500C cycles the current according to a predetermined profile, e.g. between $\pm I_{OP}^{MAX}$ or lower values as established by the Microcontroller 206 according to the Test Resistor ($P_{TEST}$) 216 being tested. In Degauss Cycle 550 the Microcontroller now drives the Amplifier 208 and DAC 210 to a current past the saturation current, $\pm I_{SATURATE}$, and then cycles down to no current through a number, N, of cycles, $C_X$, for a total period of time, T. Whilst all N cycles may be of equal duration it would be evident that each cycle $C_X$ may be of different duration. Similarly, the amplitude of each cycle may follow a predetermined mathematical relationship, e.g. exponential, linear or may be arbitrarily defined. For example, the Degauss Cycle 550 may start with a number of cycles that meet or exceed the saturation current $\pm I_{SATURATE}$ before reducing over a number of cycles that decrease linearly. Accordingly. Degauss Cycle 550 cycles the magnetic materials within the Comparator 212 to magnetic field saturation, reverses the saturation, and then cycles the magnetic field through a series of field reversals with reducing magnitude until the field is null.

Accordingly, each of the Amplifier 208 and DAC 210 are implemented to provide at least $\pm I_{SATURATE}$ which is in excess of the maximum operating current $\pm I_{OP}^{MAX}$. In Degauss Cycle 550 the primary and secondary of Comparator 212 are coupled to the Amplifier 208 and DAC 210 respectively at one end of each and to ground via first and second Load Resistors $P_{LOAD}$ 530A and 530B respectively, for example 1Ω resistors although other values may employed as determined by characteristics of one or more of the Comparator 212, DAC 210, and Amplifier 208 for example. It would be apparent that first and second Load Resistors $P_{LOAD}$ 530A and 530B respectively do not need to be accurate but rather may be nominally the target resistance.

Figure 6A:
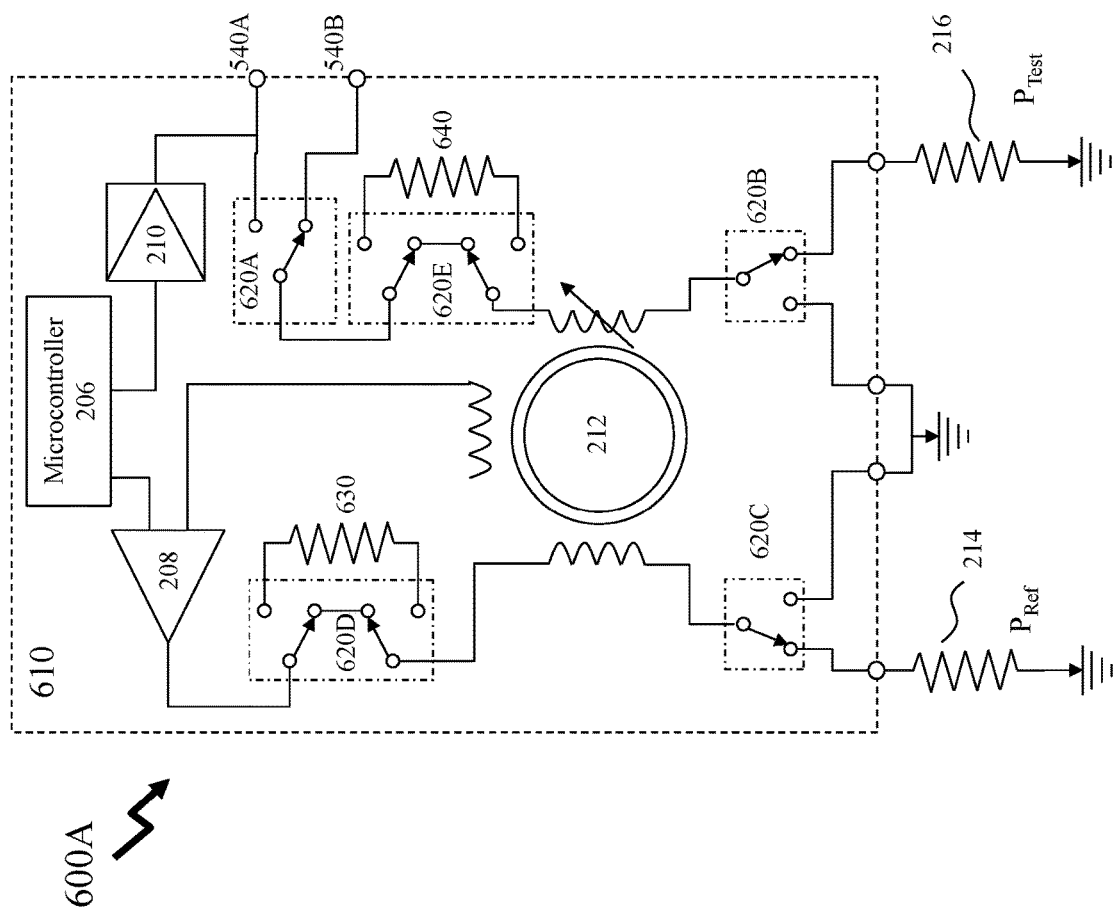
FIG. 6A depicts a block diagram of an automatic microprocessor controlled measurement system current comparator bridge according to an embodiment of the invention.

Now referring to FIG. 6A there is depicted a De-Gaussing Resistance Measurement System (DRMS) 600A according to an embodiment of the invention similarly based upon the architecture of RMS 200 described supra in respect of FIG. 2 based upon CC Bridge 202 as was DRMS 510 in FIG. 5. In contrast to DRMS 500 the first and second Load Resistors 630 and 640 are disposed within the circuit between the Comparator 212 and the Amplifier 208 and DAC 210 respectively. Accordingly, first switch 620A still selects between DAC 210 which is also coupled to port 540A or port 540B to the secondary of Comparator 212. In normal measurement mode second and third switches 620B and 630C connect the primary and secondary of Comparator 212 to reference resistor $P_{REF}$ 214 and test resistor $P_{TEST}$ 216 respectively. In degauss mode these switches connect the primary and secondary of Comparator 212 to ground on those ends and fourth and fifth switches 620D and 620E switch in the first and second Load Resistors 630 and 640 respectively.

Figure 6B:
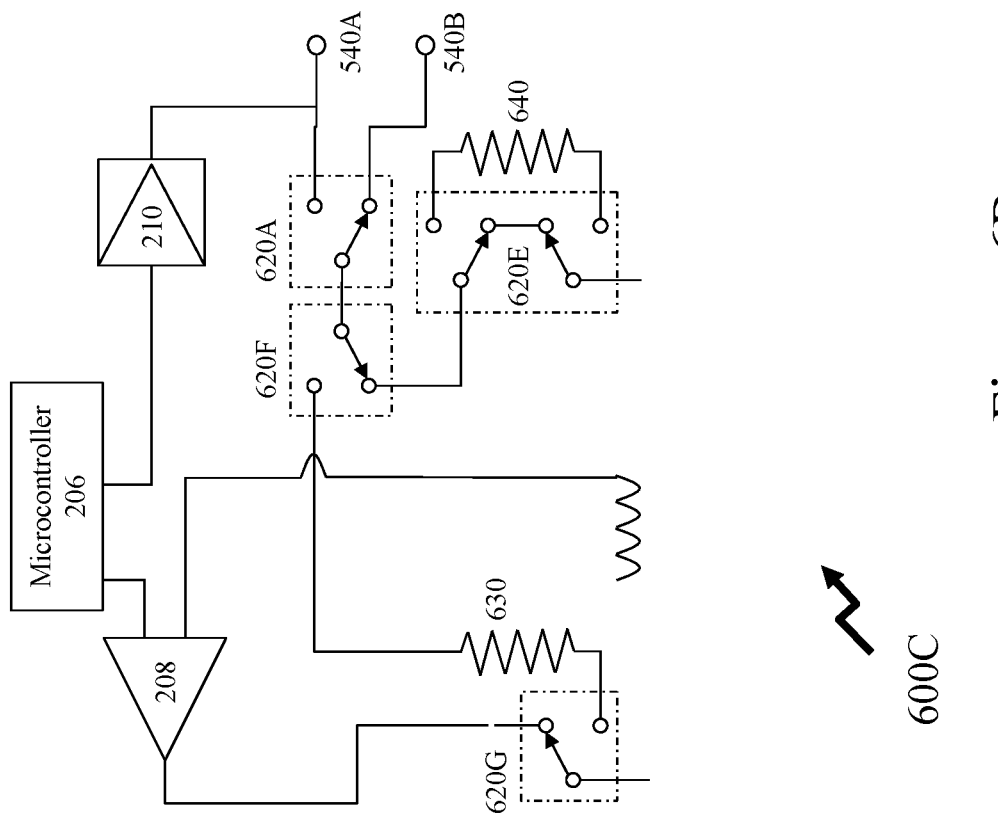
FIG. 6B depicts alternate circuit sections for the current comparator bridge of FIG. 6A according to embodiments of the invention.

Referring to FIG. 6B a first Circuit Section 600B is shown depicting part of the secondary circuit path from DAC 210 through Comparator 212 to test resistor $P_{TEST}$ 216. However, from second switch 620B rather than switching to ground directly in degauss mode the DRMS switches to ground via additional Load Resistor 650. As such a similar additional Load Resistor may be applied to the primary side of the Comparator 212 such that each of the primary and secondary sides of Comparator 212 have Load Resistors in series when the DRMS of which first Circuit Section 600B forms part. Also depicted in FIG. 6B is second Circuit Section 600C depicts an alternative embodiment according to the invention wherein the DAC 610 is employed to drive both the primary and secondary sides of the Comparator 212. Accordingly first switch 620 now couples to sixth switch 620F to select either the primary or secondary side of the Comparator 212 and fourth switch 620D is replaced with seventh switch 620G to either couple DAC 210 via first load resistor 630 to the primary side in degauss mode or couple Amplifier 208 directly to the primary side. Accordingly, in degauss mode the DAC 210 may be executed once on the primary side and once on the secondary or one only in one degauss step and then the other in a later degauss step. Optionally, when the degauss mode is executed on the primary side the secondary may be grounded via second load resistor 640 rather than floating as depicted in second Circuit Section 600C through the addition of additional elements or modification of fifth switch 620E.

Figure 6B:
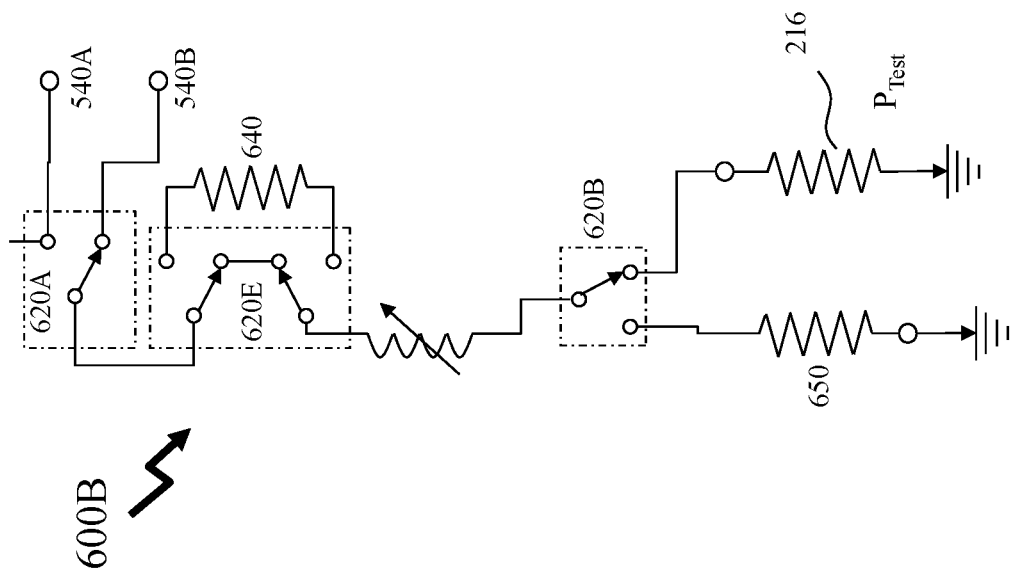
Figure 7:
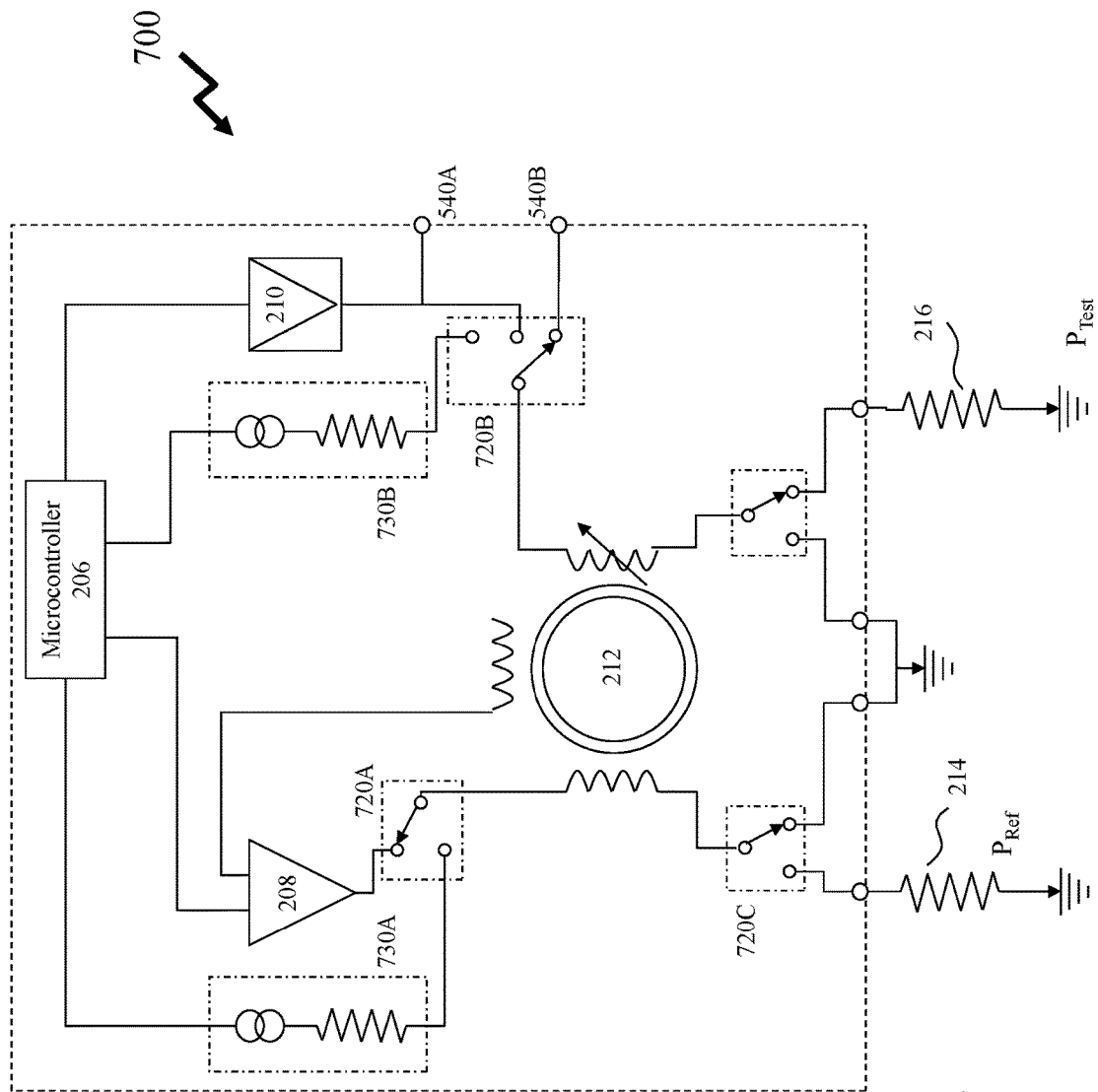
FIG. 7 depicts a current comparator bridge according to an embodiment of the invention with dedicated degaussing current sources.

Now referring to FIG. 7 there is depicted a schematic of a De-Gaussing Resistance Measurement System (DRMS) 700 according to an embodiment of the invention similarly based upon the architecture of RMS 200 described supra in respect of FIG. 2 based upon CC Bridge 202 as were DRMS 510 and 600A in FIGS. 5 and 6 respectively. As depicted Microcontroller 206 is now connected to first and second Degauss Current Sources 730A and 730B as well as Amplifier 208 and DAC 210. First Degauss Current Source 730A is switchably connected to the primary of Comparator 212 by first switch 720A whilst the other end of the primary of Comparator 212 is connected to either the Reference Resistor 214 or ground by third Switch 720C. Second Degauss Current Source 730B is switchably connected to the secondary of Comparator 212 by second switch 720B whilst the other end of the secondary of Comparator 212 is connected to either the Test Resistor 216 or ground by fourth Switch 720D. Accordingly, first and second Degauss Current Sources 730A and 730B, which include Load Resistors, are driven during the Degauss Cycle whilst Amplifier 208 and DAC 210 are driven during the measurement cycle.

Accordingly first and second Degauss Current Sources 730A and 730B may be lower accuracy, but higher current, sources than Amplifier 208 and DAC 210. First and second Degauss Current Sources 730A and 730B may be programmable via the Microcontroller 206 providing flexibility in current versus time, such as described supra with multiple cycles alternating to $\pm I_{SATURATE}$ followed by a series of cycles with reducing peak current until the cycles collapse to zero. However, first and second Degauss Current Sources 730A and 730B may also be resonant circuits providing decaying oscillatory behaviour established in dependence upon, for example, capacitance, inductance, and resistance parameters of elements which may be fixed or variable under Microcontroller 206 control.

Figure 8A:
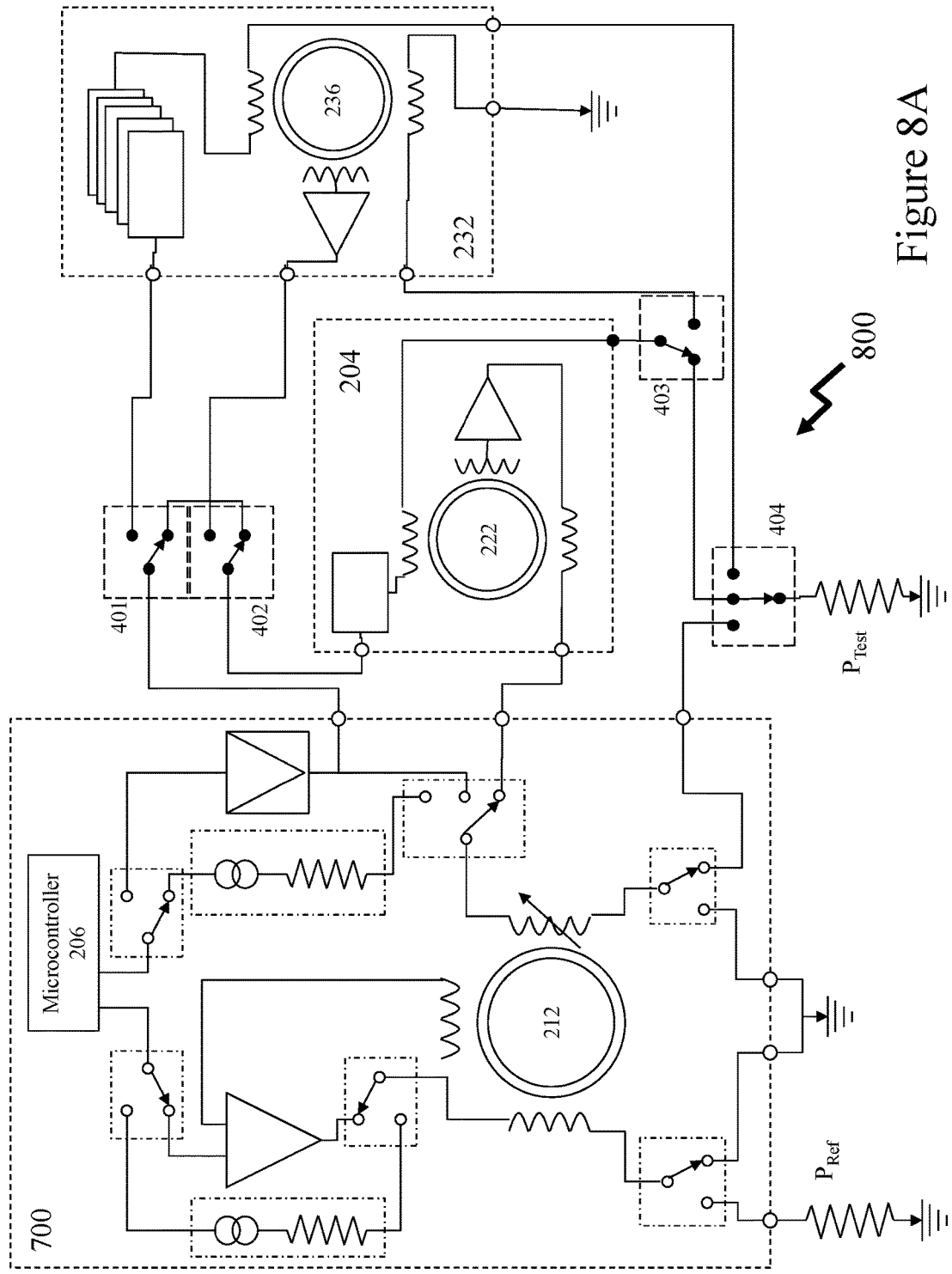
FIG. 8A depicts a block diagram of an automatic microprocessor controlled measurement system according to an embodiment of the invention comprising a current comparator bridge with a directly slaved extender and high current extenders exploiting dedicated degaussing current sources.

Now referring to FIG. 8A there is depicted an Electronically Reconfigurable ARMS (ERARMS) 800 according to an embodiment of the invention comprising De-Gaussing Resistance Measurement System (DRMS) 700 together with ICR Extender 204 and CC Extender 232 such as discussed supra in respect of FIGS. 3 and 4 respectively. Accordingly, DRMS 700 may execute a degaussing cycle for Comparator 212 within DRMS 700 as discussed supra whilst providing, through the configuration switches 401 through 404 which are controlled through the Microcontroller 206 or another controller, not shown for clarity, together with the switches internally to the DRMS 700, multiple programmable output ranges such as ±150 mA, ±3 A, and ±3000 A for example.

Figure 8B:
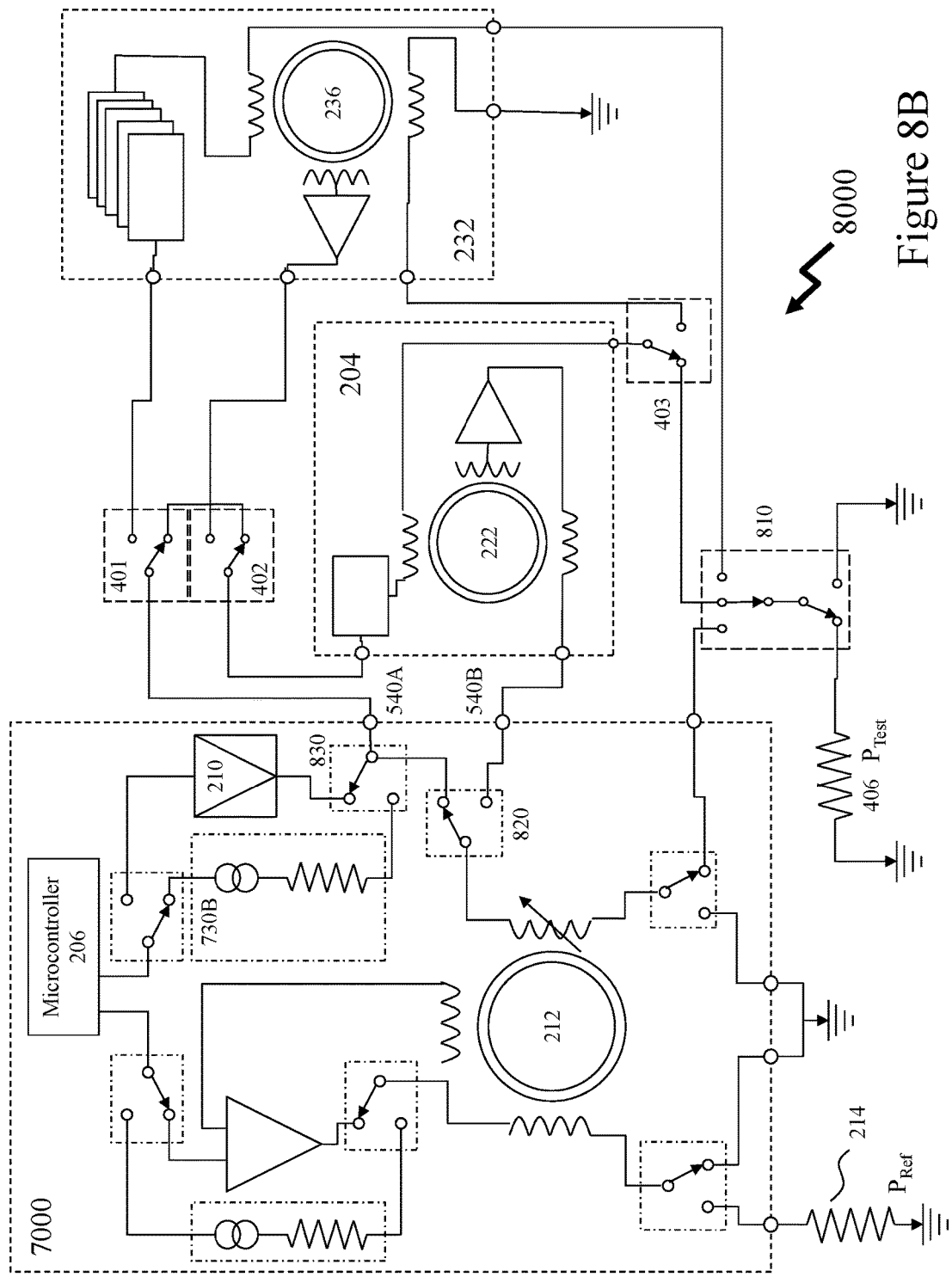
FIG. 8B depicts a block diagram of an automatic microprocessor controlled measurement system according to an embodiment of the invention comprising a current comparator bridge with a directly slaved extender and high current extenders exploiting dedicated degaussing current sources.

Referring to FIG. 8B there is depicted an ERARMS 8000 employing a Modified DRMS 7000 together with first Switch 810 which replaces fourth switch 404 in ERARMS 800. Modified DRMS 7000 replaces second switch 720B with second and third Switches 820 and 830 respectively. Second Switch 830 provides for selective coupling of the DAC 210 or second Degauss Current Source 730B to first port 540A. Similarly, first Switch 820 selectively couples either the output of second Switch 830 or second port 540B to the secondary of Comparator 212. First Switch 810 provides the same 3×1 switching connectivity as fourth switch 404 but now also provides 1×2 switching to either Test Resistance 406 or ground. Accordingly, second Degauss Current Source 730B can be coupled to first port 540A and thereafter to either ICR Extender 204 or CC Extender 232 with the other end of the ICR Current Comparator 222 or High Current Comparator 236 respectively coupled to ground through First Switch 810. Accordingly, each of the magnetic cores with the ICR Current Comparator 222 and High Current Comparator 236 may be degaussed through second Degauss Current Source 730B being executed through a current profile, e.g. Degauss Cycle 550 as discussed in respect of FIG. 5, under control of Microcontroller 206, or another controller not shown for clarity.

Optionally, the current profile executed by second Degauss Current Source 730B may be different for each of the Comparator 212, ICR Current Comparator 222, and High Current Comparator 236 according to one of more factors including, but not limited to, the characteristics of their magnetic core, the history of the comparator since last degaussing, and the current required to saturate relative to the gain provided or normal operating current. Optionally, the timing of degaussing for each of Comparator 212, ICR Current Comparator 222, and High Current Comparator 236 may be varied such as discussed below in respect of FIG. 11.

Figure 9:
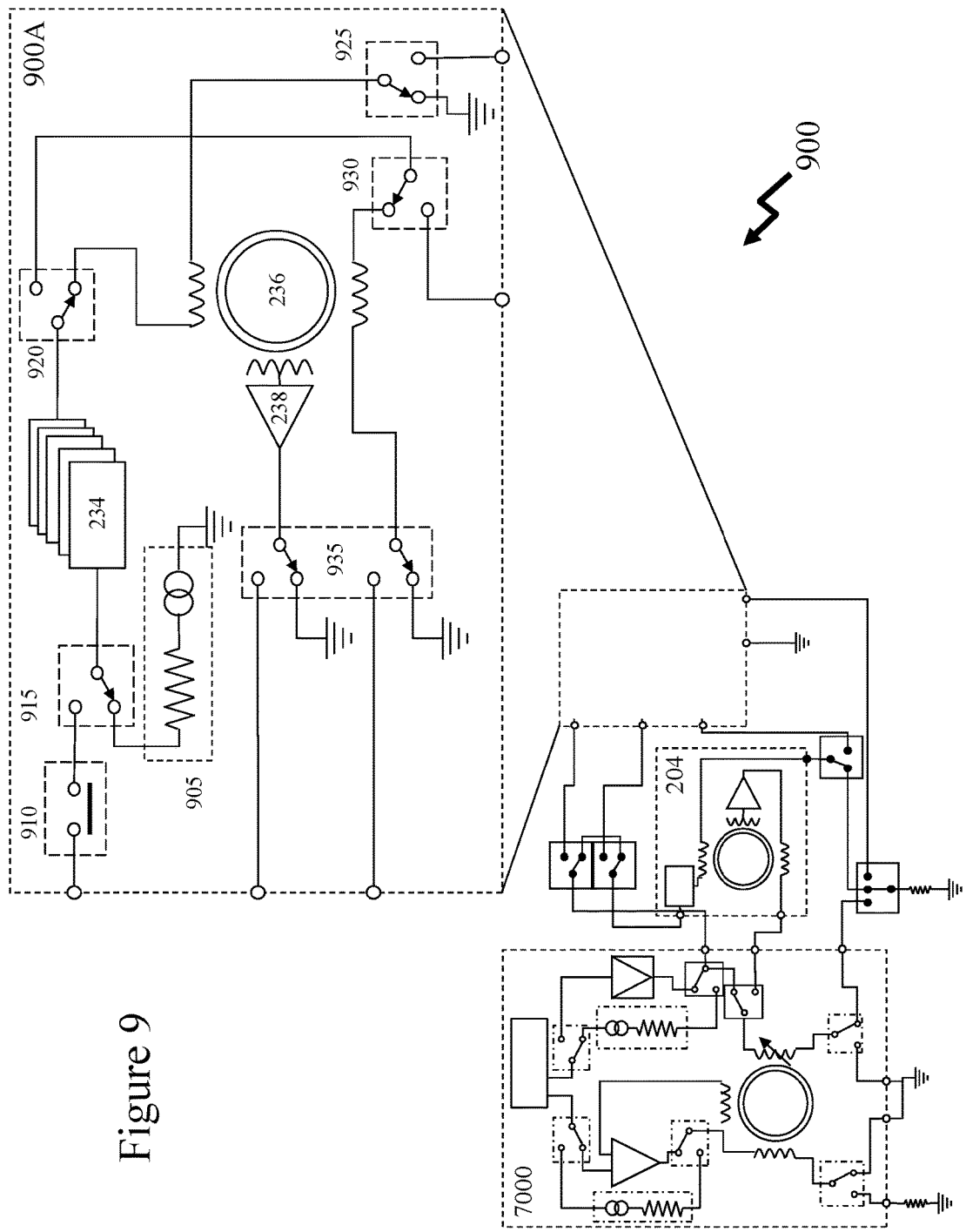
FIG. 9 depicts a block diagram of an automatic microprocessor controlled measurement system according to an embodiment of the invention comprising a current comparator bridge with a directly slaved extender and high current extenders exploiting dedicated degaussing current sources within the current comparator bridge and high current extender.

Now referring to FIG. 9 there is depicted an ERARMS 900 according to an embodiment of the invention wherein ERARMS 900 comprises Modified DRMS 7000, such as described supra in respect of FIG. 8B, ICR Extender 204, and High Current (HC) Extender 900A. As depicted HC Extender 900A provides the same functionality as CC Extender 232, such as described supra in respect of FIG. 2, through Bipolar High Current Amplifier 234, High Current (HC) Comparator 236, and Servo Amplifier 238 but is augmented with an internal degaussing function through Integral Degauss High Current Source (IDHCS) 905. As depicted IDHCS 905 may be switchably connected to either the primary and secondary windings of the HC Comparator 236 through appropriate control of first to fifth switches 915 to 935 respectively which HC 900A may be disconnected from ERARM 900 through sixth switch 910. Accordingly, degaussing of the comparators within Modified DRMS 7000 and ICR Extender 204 may be undertaken using the integral degauss current sources within the DRMS 7000 whilst degaussing of HC Comparator 236 is undertaken with IDHCS 905 within HC Extender 900A. As depicted IDHCS 905 includes the current source and load resistance although optionally multiple load resistance may be disposed after the primary and second windings and be switched into the circuit when the third and fifth switches 925 and 935 respectively switch the appropriate winding to ground.

Optionally, HC Extender 900A may include a pair of IDHCS 905 to simultaneously drive the primary and secondary windings of HC Comparator 236. Alternatively IDHC 905 may within a degaussing cycle only be driven through one of the primary and secondary windings of HC Comparator 236 and the functionality reduced with respect to the other winding or within one degaussing cycle the primary is employed followed by the secondary within a subsequent degaussing cycle. It would also be apparent that a similar functionality may be integrated within ICR Extender 204 such that each stage of the ERARM 900 may be degaussed simultaneously as opposed to sequentially or in different sequences.

Figure 10:
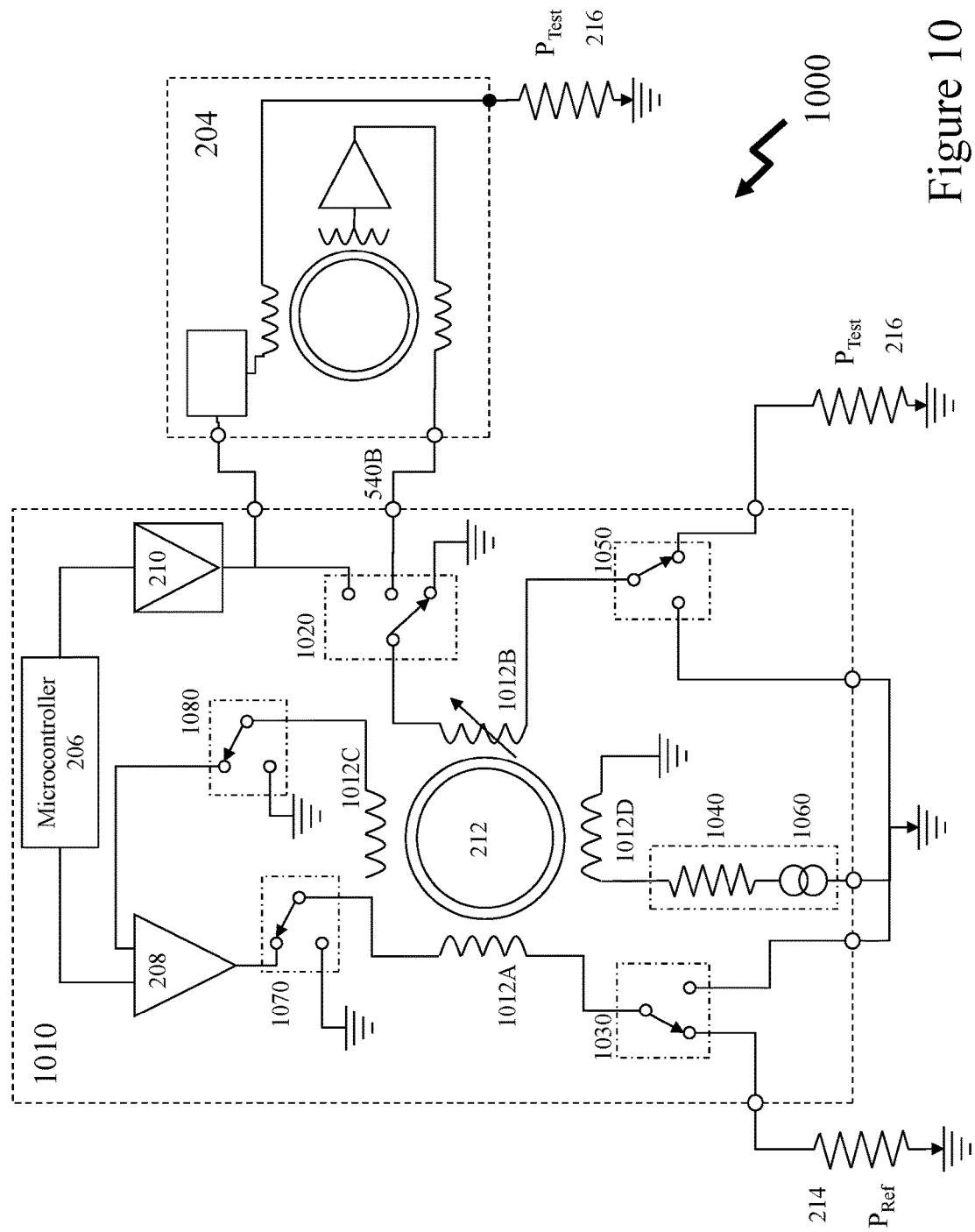
FIG. 10 depicts a block diagram of an automatic microprocessor controlled measurement system according to an embodiment of the invention comprising a current comparator bridge with a directly slaved extender exploiting a dedicated degaussing current source with fourth winding for the current comparator bridge.

Referring to FIG. 10 there is depicted a Resistance Measurement System (RMS) 1000 which makes use of a low Current Comparator Bridge 1010 and an Intermediate Current Range (ICR) Extender 204. As depicted low Current Comparator Bridge 1010 has a similar construction to CC Bridge 202 described supra in respect of FIG. 5 in that the primary and secondary windings are connected to Amplifier 208 and DAC 210/second Port 540B. However, in addition to primary and second windings 1012A and 1012B and comparator winding 1012C which feeds back to Amplifier 208 there is a fourth winding 1012D which is coupled to Degauss Current Source 1060 via Load Resistor 1040. When Degauss Current Source 1060 is operated under action of Microcontroller 206 or another controller, not shown for clarity, first to fourth switches 1020, 1030, 1050, and 1070 couple the primary and secondary windings 1012A and 1012B to ground as well as comparator winding 1012C. Accordingly, Degauss Current Source 1060 may as described supra in respect of other embodiments of the invention be a low accuracy current source rather than an accurate current source such as Amplifier 208 and DAC 210. Optionally, ICR Extender 204 may be similarly configured with an additional winding and dedicated Degauss Current Source.

Figure 11:
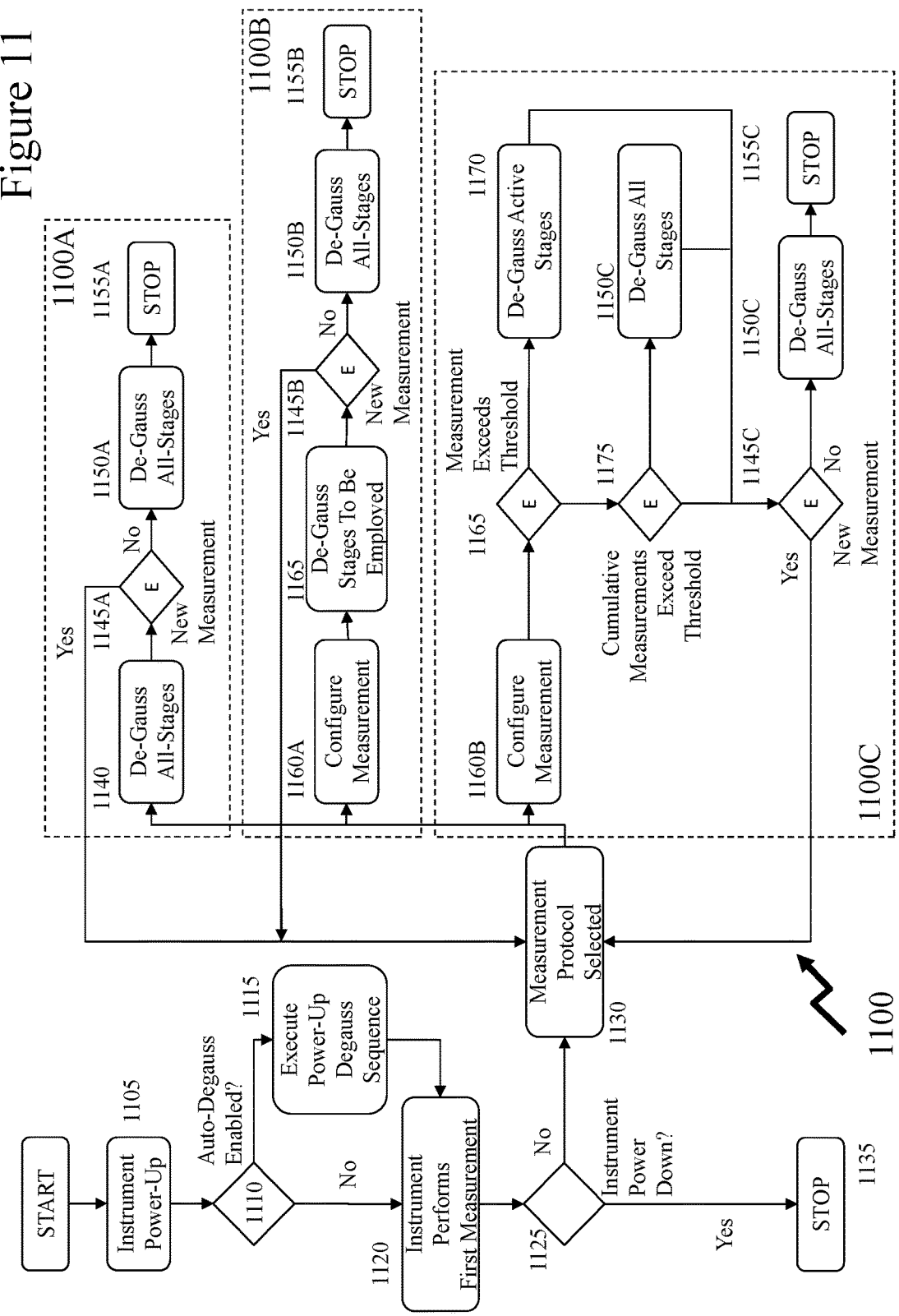
FIG. 11 depicts an exemplary flowchart for an automatic micro-processor controlled measurement system according to an embodiment of the invention comprising degaussing current sources.

Now referring to FIG. 11 there is depicted an exemplary flowchart 1100 for a controller within a measurement system exploiting one or more degaussing circuits such as described supra in respect of FIGS. 5 through 10 for example. The process begins with Instrument Power Up 1105 wherein the measuring instrument is either connected to mains power and turned on or if handheld or remote and being operated from a battery simply turned on. Next the process checks in step 1110 whether Auto-Degauss has been enabled wherein a positive determination results in the process proceeding to step 1115 wherein a Power-Up Degauss Sequence is executed such that, for example all compensators within the instrument are cycled to reduce residual magnetization and the process proceeds to step 1120 wherein the instrument performs the first measurement. If no Auto-Degauss was enabled then in step 1110 the process would have proceeded directly to step 1120. In step 1120 a determination is made as to whether the Instrument is to be Powered Down or whether other measurements may be made. If to be Powered Down the process proceeds to step 1135 and stops. Optionally, another Auto-Degauss or other Degauss Process may be performed as part of a controlled Power Down of the instrument.

If more measurements are to be performed then the process proceeds to step 1130 wherein a Measurement Protocol is selected. This selection may be automatically determined by the controller in dependence upon the test to be performed or alternatively may be established as a factory default or selected by a user of the Instrument. Based upon the selection the process flow proceeds to one of three Sub-Flows 1100A to 1100C respectively. Optionally, only one, two, or all may be implemented within the Instrument as well as others not described within respect of FIG. 11. Additional Sub-Flows may be added to the Instrument through one or more interfaces such as USB, memory card, wireless, and Wi-Fi for example. For simplicity, the measurement steps in each of first to third Sub-Flows 1100A to 1100C respectively have been omitted but it would be evident to one skilled in the art where these would be inserted into the Sub-Flows.

First Sub-Flow 1100A, a simple sub-flow, begins with step 1140 wherein all current comparators within the Instrument are degaussed before the measurement and afterwards in step 1145A the process determines whether another measurement will be made. If yes then the process returns to step 1130 otherwise the first Sub-Flow 1100A proceeds to step 1150A degausses all current comparator stages and stops in step 1155A. Second Sub-Flow 1100B begins with step 1160A wherein the measurement to be performed is configured upon the instrument. Next in step 1165 those current comparators to be employed within the measurement are degaussed before the process in step 1145B determines whether another measurement will be made. If yes then the process returns to step 1130 otherwise the second Sub-Flow 1100B proceeds to step 1150B degausses all current comparator stages and stops in step 1155B

In third Sub-Flow 1100C the process starts with step 1160B wherein the measurement to be performed is configured upon the instrument. In step 1165 a determination is made as to whether the measurement to be performed exceeds a predetermined threshold. If yes the process proceeds to step 1170 wherein all current comparator stages are degaussed and if not the process proceeds to step 1175. After step 1170 the process proceeds to step 1145C to determine whether another measurement is to be performed or not. If yes the process proceeds back to step 1130 otherwise it proceeds to step 1150C, degausses all current comparator stages, and then stops in step 1155C. If in step 1165 the measurement to be performed do not exceed the predetermined threshold then the process proceeds to step 1175 wherein a determination is made as to whether the cumulative measurements since a last degauss process was executed have exceeded a predetermined threshold. If yes the process proceeds to step 1150C wherein all stages are degaussed and then step 1145C and if not the process proceeds directly to step 1145C.

It would be evident that optionally within third Sub-Flow 1100C step 1175 may be a determination against multiple predetermined thresholds with degaussing of different combinations of current comparators. For example, in FIG. 8B an ERARMS 8000 providing programmable resistance measurements over multiple programmable output ranges such as ±150 mA, ±3 A, and ±3000 A for example may have predetermined thresholds for step 1165 established as 50 mA, 1 A, and 30 A such that:

if $I_{MEAS}$>50 mA degauss Comparator 212 in Modified DRMS 7000;

if $I_{MEAS}$>1 A degauss Comparator 212 and ICR Current Comparator 222 in Modified DRMS 7000 and ICR Extender 204 respectively; and if $I_{MEAS}$>30 A degauss Comparator 212, ICR Current Comparator 222, and High Current Comparator 236 in Modified DRMS 7000, ICR Extender 204, and CC Extender 232 respectively.

Similarly, cumulative thresholds for step 1175 may be 25 mA, 500 mA, and 20 A as well such that:

$\Sigma I_{MEAS}$>25 mA degauss Comparator 212 in Modified DRMS 7000;

if $\Sigma I_{MEAD}$>500 mA degauss Comparator 212 and ICR Current Comparator 222 in Modified DRMS 7000 and ICR Extender 204 respectively; and if $\Sigma I_{MEAS}$>20 A degauss Comparator 212, ICR Current Comparator 222, and High Current Comparator 236 in Modified DRMS 7000, ICR Extender 204, and CC Extender 232 respectively.

Figure 12:
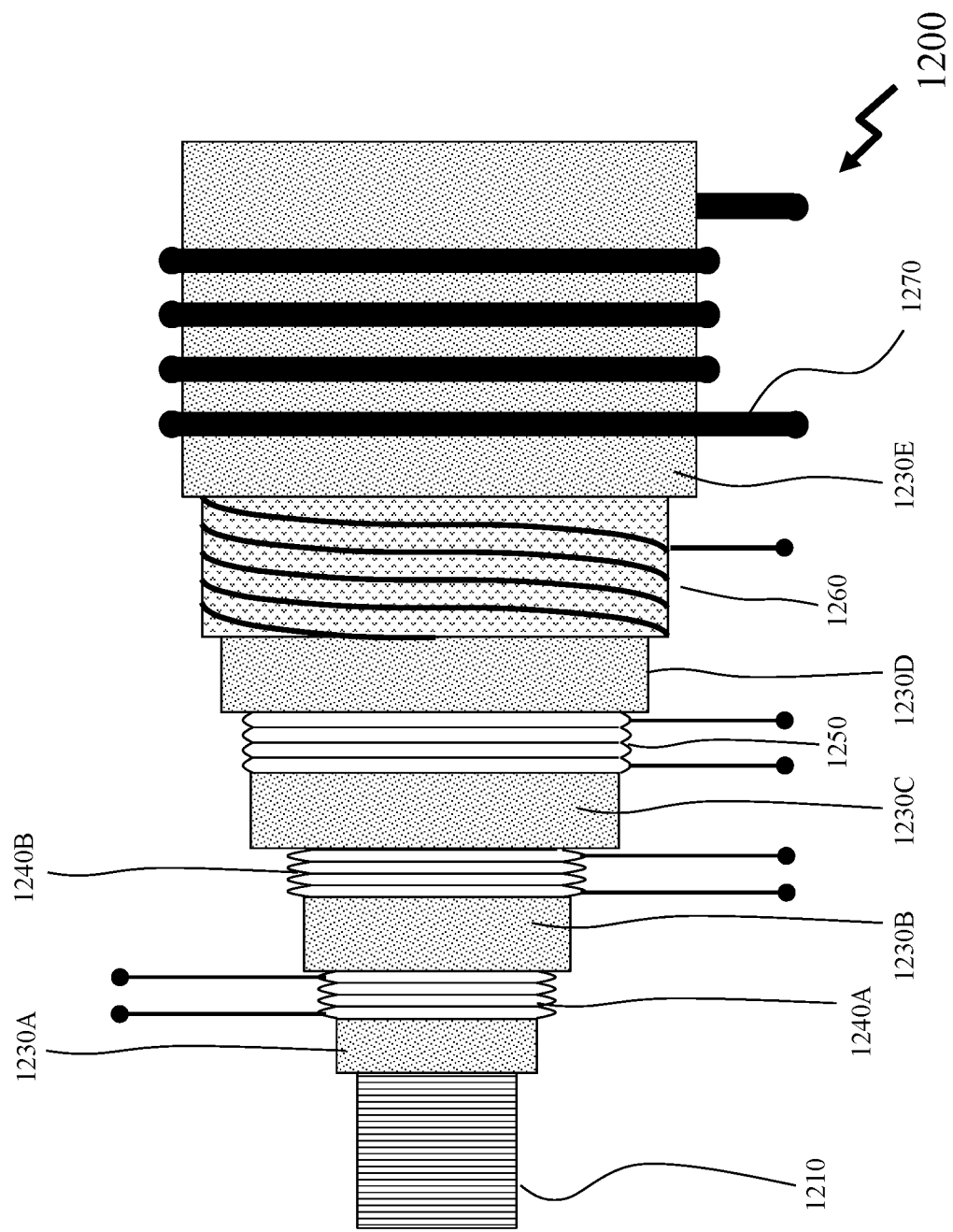
FIG. 12 depicts an exemplary construction of a current comparator according to an embodiment of the invention.

Referring to FIG. 12 there is depicted a Current Comparator (CC) 1200 according to an embodiment of the invention showing the CC 1200 sequentially stripped from the outermost layer towards the magnetic core 1210. Accordingly as shown the CC 1210 comprises a magnetic core 1210 over which is wrapped first tape layer 1230A separating the first winding 1240A from it. Second tape layer 1230B is then wrapped over first winding 1240A upon which is then wrapped second winding 1240B. These layers are then over-wrapped with third tape layer 1230C followed by third winding 1250, fourth tape layer 1230D, shielding 1260, fifth tape layer 1230E and fourth winding 1270. As depicted first winding 1240A corresponds to the primary winding of the CC 1200, second winding 1240B corresponds to the secondary winding of the CC 1200, and third winding 1250 corresponds to comparator output, e.g. the winding on ICR Current Comparator 222 which provides the input to servo tracking amplifier 224 as depicted in FIG. 2. Fourth winding 1270 provides the winding for a dedicated degauss current source connection such as depicted supra in respect of FIG. 10 with fourth winding 1012D.

Figure 13A:
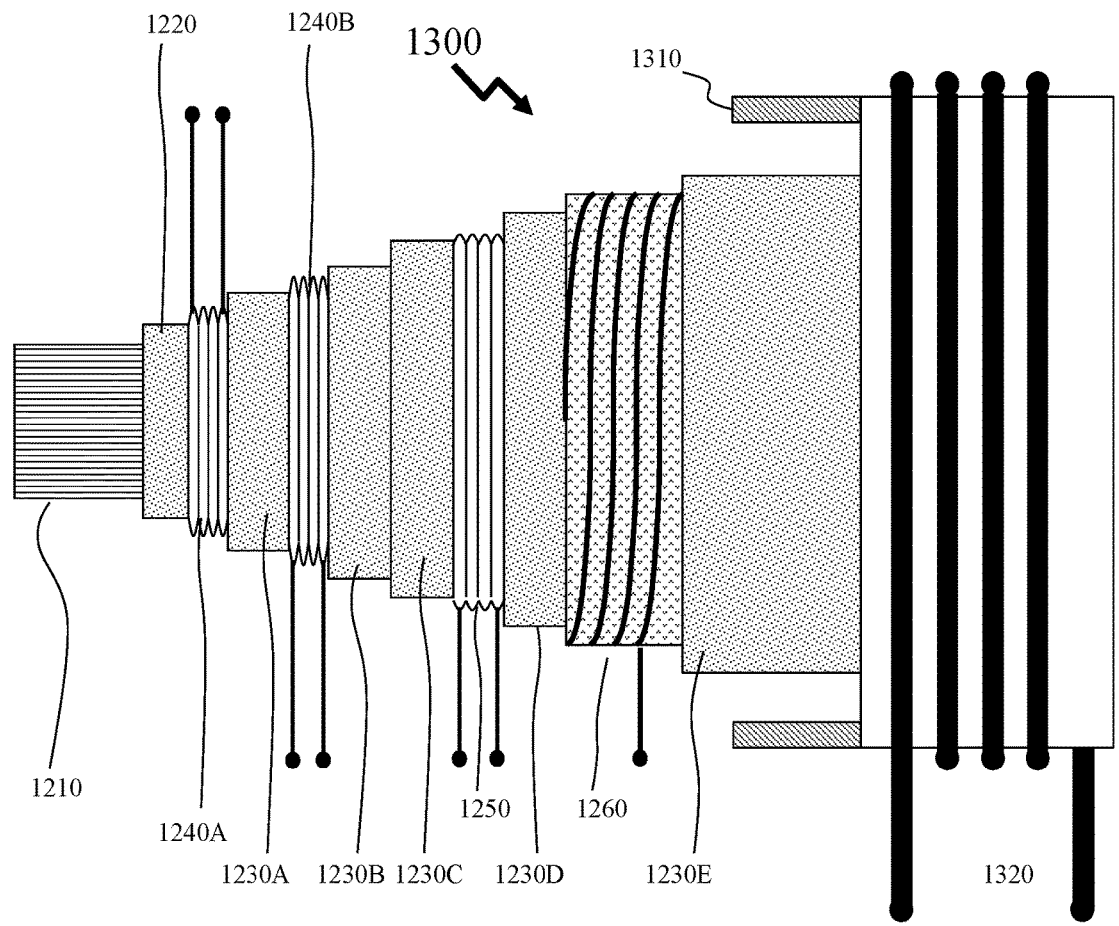
FIGS. 13A and 13B depict an exemplary construction of a current comparator with magnetic shield and shield degaussing winding according to an embodiment of the invention.
Figure 13B:
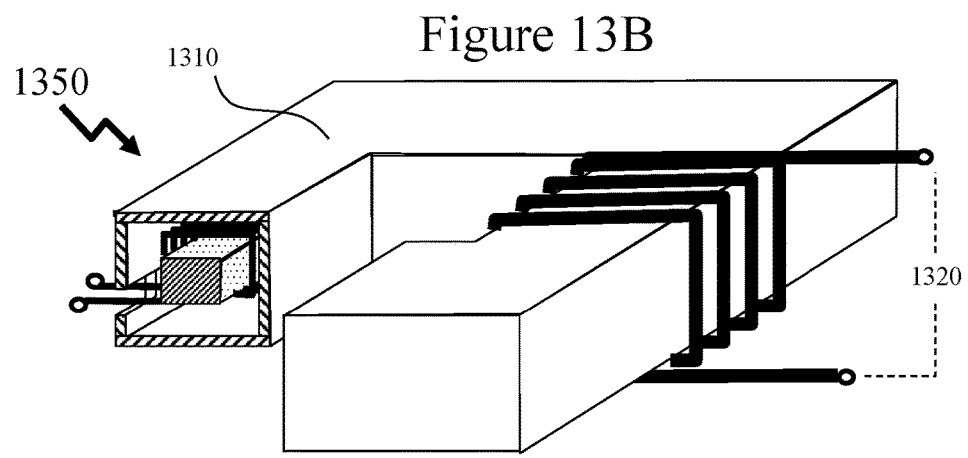

Referring to FIG. 13A there is depicted a Current Comparator (CC) 1300 according to an embodiment of the invention showing the CC 1300 sequentially stripped from the outermost layer towards the magnetic core 1210. Accordingly as shown the CC 1210 comprises a magnetic core 1210 over which is wrapped first tape layer 1230A separating the first winding 1240A from it. Second tape layer 1230B is then wrapped over first winding 1240A upon which is then wrapped second winding 1240B. These layers are then over-wrapped with third tape layer 1230C followed by third winding 1250, fourth tape layer 1230D, shielding 1260, and fifth tape layer 1230E. As depicted first winding 1240A corresponds to the primary winding of the CC 1200, second winding 1240B corresponds to the secondary winding of the CC 1200, and third winding 1250 corresponds to comparator output, e.g. the winding on ICR Current Comparator 222 which provides the input to servo tracking amplifier 224 as depicted in FIG. 2. Also depicted is magnetic shield 1310 surrounding the CC 1300 upon which is wound shield degauss winding 1320.

Figure 14:
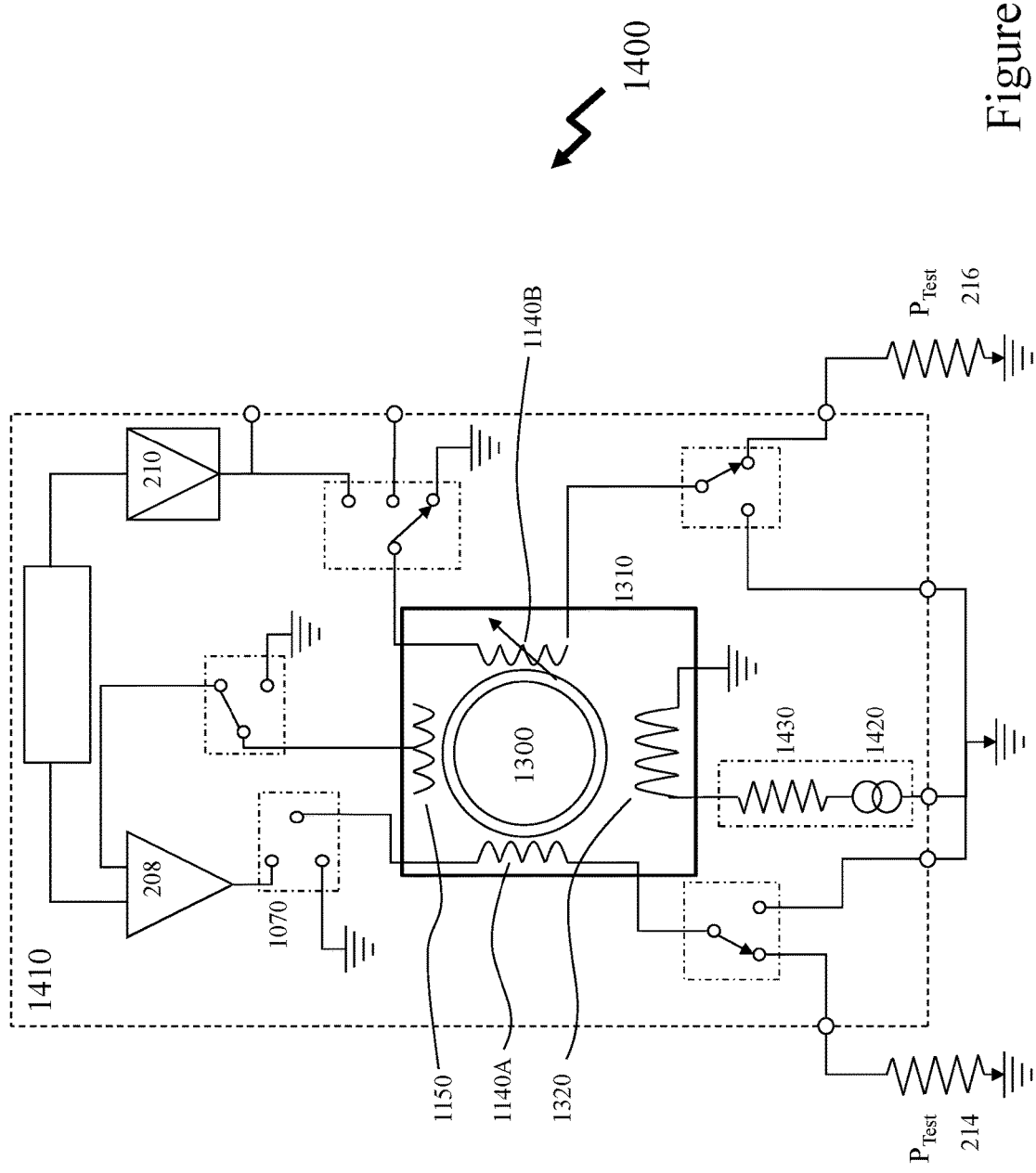
FIG. 14 depicts a block diagram of an automatic microprocessor controlled measurement system according to an embodiment of the invention comprising a current comparator bridge with magnetic shield and shield degaussing winding such as depicted in FIGS. 13A and 13B.

Perspective view 1350 shows a partial cross-section three-dimensional view of the CC 1300 showing square magnetic core 1210 with the magnetic shield 1310 surrounding upon which is wound Shield Degauss Winding 1320. Also it is evident how the windings on CC 1300 pass through a portion of magnetic shield 1310. Referring to FIG. 14 there is depicted a DRMS 1410 incorporating magnetic shield 1310 around Comparator 1300 together with Shield Degauss Winding 1320 which is coupled to Degauss Current Source 1420 via Load Resistor 1430. Accordingly, under action of a controller the Degauss Current Source 1420, which may be a coarse current source, may cycle at predetermined points within periods of use of the Instrument of which DRMS 1410 forms part in order to degauss the magnetic shield. Subsequently degaussing of the magnetic core of the Comparator 1300 may be executed through first winding 1140A, being the primary, from Amplifier 208 and second winding 1140B, being the secondary, from DAC 210. Third winding 1150 being coupled to Amplifier 208 as part of the feedback from Comparator 1300.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A resistance measurement system for generating a bi-polar current, comprising:
   a microcontroller for controlling operating of the resistance measurement system;
   a current comparator bridge comprising;
      a first programmable current source coupled to the microcontroller for generating a first signal having a defined bi-polar current;
      a second programmable current source coupled to the microcontroller for generating a second signal having a defined bi-polar current;
      a first current source and a second current source, each coupled to the microcontroller for generating a first predetermined current profile under control of the microcontroller to initially saturate a magnetic core of a first comparator and subsequently iteratively cycle the current through negative and positive cycles to null the magnetic field within the magnetic core;
      a first switching circuit coupled to the microcontroller for selectively connecting in a first configuration an input of a first winding of the current comparator bridge to the first current source, in a second configuration the input of the first winding of the current comparator bridge to the first programmable current source, in a third configuration coupling the first current source to an output port of the current comparator bridge and an input port of the current comparator bridge to the input of the first winding of the current comparator bridge, and in a fourth configuration coupling the first programmable current source to the output port of the current comparator bridge and an input port of a current extender to the input of the first winding of the current comparator bridge;
      a second switching circuit coupled to the microcontroller for selectively connecting an input of a second winding of the current comparator bridge to either the second current source or the second programmable current source;
      the first comparator for receiving the output of the first switching circuit en route to a test resistor and the output of the second switching circuit en route to a reference resistance;
      a third switching circuit coupled to the microcontroller for selectively connecting an output of the first winding of the current comparator bridge to either ground or a test resistance;
      a fourth switching circuit coupled to the microcontroller for selectively connecting an output of the second winding of the current comparator bridge to either ground or a reference resistance;
   a fifth switching circuit coupled to the output port of the current comparator bridge for selectively coupling the output port of the current comparator bridge to either an input port of the current extender or an input port of a high current extender and when coupling the output port of the current comparator bridge to the input port of the high current extender coupling a first output port of the high current extender to the input port of the current extender;

the current extender comprising;
  a bi-polar amplifier coupled to the input port of the current extender for amplifying a received signal; and
  a second comparator for receiving the output of the bipolar amplifier, for controlling a second current tracking amplifier to generate and transmit a signal having a defined bi-polar current to the secondary input of the current comparator bridge, and for receiving the output of the second current tracking amplifier en route to the secondary input of the current comparator bridge; and the high current extender comprising:
  the input port;
  a third current source coupled to the microcontroller for generating a first predetermined current profile under control of the microcontroller to initially saturate a magnetic core of a third comparator and subsequently iteratively cycle the current through negative and positive cycles to null the magnetic field within the magnetic core;
  a high current amplifier;
  a sixth switching circuit coupled to the microcontroller for selectively coupling either an input signal received at the input port or the third current source to the high current amplifier;
  the third comparator for receiving the output of the high current amplifier and for controlling a third current tracking amplifier to generate and transmit a signal having a defined bi-polar current to the fifth switching circuit;
  a seventh switching circuit coupled to the microcontroller for selectively connecting in a first configuration the output of the high current amplifier to a first winding of the third comparator and the output of the first winding of the third comparator to ground, in a second configuration the output of the high current amplifier to the first winding of the third comparator and the output of the first winding of the third comparator to a second output of the high current extender, in a third configuration the output of the high current amplifier to a second winding of the third comparator and therein to the first output of the high current extender; and
an eighth switching circuit coupled to the microcontroller
  a first input port coupled to the third switching circuit;
  a second input port coupled to the extender for receiving the output of the bipolar amplifier;
  a third output port coupled to the second output of the high current extender; and
  an output port for coupling to the test resistor.

2. The resistance measurement system of claim 1, wherein the first programmable current source is a digital to analog converter;
the second programmable current source is a current tracking amplifier; and
the first comparator receives the output of the first switching circuit en route to the reference resistor via a secondary winding of the first comparator and the output of the second switching circuit en route to the test resistance via a primary winding of the first comparator.

3. The resistance measurement system of claim 1, wherein the microcontroller selectively configures the resistance measurement system to degauss the first comparator by at least one of coupling the first current source to ground via a first winding of the first comparator and coupling the second current source to ground via a second winding of the first comparator.

4. The resistance measurement system of claim 1, wherein the microcontroller selectively configures the resistance measurement system to degauss the second comparator coupling the first current source to ground via a first winding of the second comparator.

5. The resistance measurement system of claim 1, wherein the microcontroller selectively configures the resistance measurement system to degauss the third comparator by at least one of coupling the third current source to ground via a first winding of the third comparator and coupling the third current source to ground via a second winding of the third comparator.

6. The resistance measurement system according to claim 1, wherein
  at least one of the first current source, the second current source, and the third current source are resonant circuits with decaying oscillatory output.

7. The resistance measurement system according to claim 1, wherein
  the period of oscillation of at least one of the first current source, the second current source, and the third current source is fixed.

8. The resistance measurement system according to claim 1, wherein
  the period of oscillation of at least one of the first current source, the second current source, and the third current source is variable and established by the microcontroller.

9. A method comprising:
providing a microcontroller;
providing a current comparator bridge comprising:
  a first current source comprising a first programmable current source coupled to the microcontroller for generating a first signal having a defined bi-polar current and a first degaussing current source for generating a first predetermined current profile;
  a second current source comprising a second programmable current source coupled to the microcontroller for generating a second signal having a defined bi-polar current and a second degaussing current source for generating a second predetermined current profile;
  a first current comparator comprising a first winding for receiving the output of the first current source en route to a reference resistor, a second winding for receiving the output of a second switching circuit en route to a test resistor, and a first current tracking amplifier to generate and selectively couple the generated signal to the second programmable current source;
  a first port for coupling the reference resistor between the first current comparator and ground;
  a second port for coupling the test resistor between the first current comparator and ground;
providing a current extender comprising:
  a bi-polar amplifier selectively coupled to the current comparator bridge for amplifying a signal selectively coupled to the current extender; and
  a second current comparator for receiving the output of the bipolar amplifier and for controlling a second current tracking amplifier to generate and selectively couple the generated signal to the current comparator bridge;

providing a high current extender comprising:
- a high current amplifier selectively coupled to either the current comparator bridge or to a third degaussing current source which generates a third predetermined current profile;
- a third current comparator for receiving the output of the high current amplifier and for controlling a third current tracking amplifier to generate and selectively couple the generated signal to the current extender; and providing a switching fabric comprising:
- a first portion within the current comparator bridge;
- a second portion disposed between the current comparator bridge and each of the current extender and high current extender; and
- a third portion within the high current extender.

10. The method according to claim 9, wherein
in a first configuration the current comparator bridge is configured by the microcontroller to couple the first programmable current source to the test resistor;
in a second configuration the current comparator bridge, the switching fabric, and the current extender are configured by the microcontroller to couple the first programmable current source to the test resistor via the current extender;
in a third configuration the current comparator bridge, the switching fabric, the current extender, and the high current extender are configured by the microcontroller to couple the first programmable current source to the test resistor via the high current extender;
in a fourth configuration the current comparator bridge is configured by the microcontroller to couple the first degaussing current source to ground via the first current comparator;
in a fifth configuration the current comparator bridge, the switching fabric, and the current extender are configured by the microcontroller to couple the first degaussing current source to ground via the current extender; and
in a sixth configuration the high current extender is configured by the microcontroller to couple the third degaussing current source to the test resistor via the high current extender.

11. The method according to claim 9, wherein
the first programmable current source is a digital to analog converter;
the second programmable current source is a current tracking amplifier.

12. The method according to claim 9, wherein
at least one of the first degaussing current source, the degaussing second current source, and the third degaussing current source is a resonant current source circuit with decaying oscillatory output with predetermined frequency of oscillation.

13. The method according to claim 9, wherein
at least one of the first degaussing current source, the degaussing second current source, and the third degaussing current source is a resonant current source circuit with decaying oscillatory output with a variable frequency of oscillation established by the microcontroller.

14. The method according to claim 9, wherein
at least one of the first predetermined current profile and the second predetermined current profile
are established under control of the microcontroller to initially saturate a magnetic core of either the first current comparator or the second current comparator and subsequently iteratively cycle the current through negative and positive cycles to null the magnetic field within the magnetic core.

15. The method according to claim 9, wherein
the third predetermined current profile is established under control of the microcontroller to initially saturate a magnetic core of the third current comparator and subsequently iteratively cycle the current through negative and positive cycles to null the magnetic field within the magnetic core.

16. The method according to claim 9, further comprising
establishing a degaussing mode for the current comparator bridge mode under direction of the microcontroller by coupling the first degaussing current source to ground via a load resistor and the first winding of first current comparator; wherein
the microcontroller establishing the degaussing mode is triggered by at least one of:
  receiving a command for a measurement to be made;
  receiving a command for a measurement to be made wherein a characteristic of the measurement exceeds a predetermined threshold;
  receiving a command for a measurement to be made wherein a cumulative summation of a characteristic of a predetermined subset of previous measurements exceeds a predetermined threshold.

17. The method according to claim 9, further comprising
establishing a degaussing mode for the current comparator bridge mode under direction of the microcontroller by coupling the second degaussing current source to ground via a load resistor and the second winding of first current comparator; wherein
the microcontroller establishing the degaussing mode is triggered by at least one of:
  receiving a command for a measurement to be made;
  receiving a command for a measurement to be made wherein a characteristic of the measurement exceeds a predetermined threshold;
  receiving a command for a measurement to be made wherein a cumulative summation of a characteristic of a predetermined subset of previous measurements exceeds a predetermined threshold.

18. The method according to claim 9, further comprising
establishing a degaussing mode for the current comparator bridge mode under direction of the microcontroller by coupling the third degaussing current source to ground via a load resistor and the third current comparator; wherein
the microcontroller establishing the degaussing mode is triggered by at least one of:
  receiving a command for a measurement to be made;
  receiving a command for a measurement to be made wherein a characteristic of the measurement exceeds a predetermined threshold;
  receiving a command for a measurement to be made wherein a cumulative summation of a characteristic of a predetermined subset of previous measurements exceeds a predetermined threshold.

* * * * *